(12) United States Patent
Ohnuma

(10) Patent No.: US 8,592,907 B2
(45) Date of Patent: Nov. 26, 2013

(54) SEMICONDUCTOR DEVICE AND METHOD FOR MANUFACTURING THE SAME

(75) Inventor: Hideto Ohnuma, Atsugi (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 31 days.

(21) Appl. No.: 13/075,460

(22) Filed: Mar. 30, 2011

(65) Prior Publication Data

US 2011/0175146 A1     Jul. 21, 2011

Related U.S. Application Data

(62) Division of application No. 12/078,085, filed on Mar. 27, 2008, now Pat. No. 7,923,781.

(30) Foreign Application Priority Data

May 17, 2007    (JP) ................................ 2007-131229

(51) Int. Cl.
     *H01L 27/12*        (2006.01)
(52) U.S. Cl.
     USPC ............... 257/347; 257/67; 257/68; 257/69; 257/70; 257/E27.108; 257/E27.109; 257/E27.111; 257/E27.112
(58) Field of Classification Search
     USPC ............... 257/347, 67, 68, 69, 70, E27.108, 257/E27.109, E27.111, E27.112
See application file for complete search history.

(56) References Cited

U.S. PATENT DOCUMENTS

| | | |
|---|---|---|
| 4,933,298 A | 6/1990 | Hasegawa |
| 5,384,473 A * | 1/1995 | Yoshikawa et al. ........... 257/255 |
| 6,380,046 B1 | 4/2002 | Yamazaki |
| 6,770,515 B1 | 8/2004 | Makita et al. |

(Continued)

FOREIGN PATENT DOCUMENTS

| | | |
|---|---|---|
| JP | 05-090117 | 4/1993 |
| JP | 07-297377 | 11/1995 |

(Continued)

OTHER PUBLICATIONS

European Search Report (Application No. 08005697.1) Dated May 30, 2011.

(Continued)

*Primary Examiner* — Long K Tran
(74) *Attorney, Agent, or Firm* — Eric J. Robinson; Robinson Intellectual Property Law Office, P.C.

(57) ABSTRACT

It is an object to achieve high performance of a semiconductor integrated circuit depending on not only a microfabrication technique but also another way and to achieve low power consumption of a semiconductor integrated circuit. A semiconductor device is provided in which a crystal orientation or a crystal axis of a single-crystalline semiconductor layer for a MISFET having a first conductivity type is different from that of a single-crystalline semiconductor layer for a MISFET having a second conductivity type. A crystal orientation or a crystal axis is such that mobility of carriers traveling in a channel length direction is increased in each MISFET. With such a structure, mobility of carriers flowing in a channel of a MISFET is increased, and a semiconductor integrated circuit can be operated at higher speed. Further, low voltage driving becomes possible, and low power consumption can be achieved.

17 Claims, 21 Drawing Sheets

(56) References Cited

U.S. PATENT DOCUMENTS

| | | |
|---|---|---|
| 6,821,826 B1 | 11/2004 | Chan et al. |
| 6,908,797 B2 | 6/2005 | Takano |
| 7,052,974 B2 | 5/2006 | Mitani et al. |
| 7,199,024 B2 | 4/2007 | Yamazaki |
| 7,235,433 B2 | 6/2007 | Waite et al. |
| 7,298,009 B2 | 11/2007 | Yan et al. |
| 7,312,487 B2 | 12/2007 | Alam et al. |
| 7,332,384 B2 | 2/2008 | Buchholtz et al. |
| 2002/0070454 A1 | 6/2002 | Yasukawa |
| 2005/0275018 A1 | 12/2005 | Venkatesan et al. |
| 2006/0006389 A1 | 1/2006 | Buchholtz et al. |
| 2006/0017137 A1 | 1/2006 | Iwamatsu |
| 2006/0043484 A1 | 3/2006 | Cabral et al. |
| 2006/0091427 A1 | 5/2006 | Waite et al. |
| 2006/0170045 A1 | 8/2006 | Yan et al. |
| 2006/0194384 A1 | 8/2006 | Venkatesan et al. |
| 2006/0292770 A1 | 12/2006 | Wu et al. |
| 2008/0026520 A1 | 1/2008 | Yan et al. |
| 2009/0050941 A1 | 2/2009 | Yamazaki et al. |
| 2009/0078939 A1 | 3/2009 | Yamazaki et al. |

FOREIGN PATENT DOCUMENTS

| | | |
|---|---|---|
| JP | 11-145438 A | 5/1999 |
| JP | 2000-012864 | 1/2000 |
| JP | 2005-039171 | 2/2005 |
| JP | 2006-040911 A | 2/2006 |
| WO | WO-2006/049833 | 5/2006 |

OTHER PUBLICATIONS

European Search Report (Application No. 08005697.1) Dated Aug. 4, 2011.

* cited by examiner

SEMICONDUCTOR DEVICE AND METHOD FOR MANUFACTURING THE SAME

BACKGROUND OF THE INVENTION

1. Field of the Invention

The present invention relates to a semiconductor device having a so-called SOI (silicon on insulator) structure in which a semiconductor layer is provided on an insulating surface.

2. Description of the Related Art

Integrated circuits using semiconductor substrates called silicon on insulator (hereinafter also referred to as "SOI") in which a thin single-crystalline semiconductor layer is formed on an insulating surface instead of using silicon wafers that are manufactured by thinly slicing an ingot of a single-crystalline semiconductor are developed. The integrated circuits using the SOI substrates draw attention as semiconductor integrated circuits whose performance is improved by reduction of parasitic capacitance between a drain of a transistor and a substrate.

There are various manufacturing methods of SOI substrates, and an SOI substrate formed by a method called Smart Cut (registered trademark) is known as an SOI substrate which has achieved both quality of an SOI layer and easiness in production (throughput). This SOI substrate is formed in the following manner. Hydrogen ions are implanted to a bond wafer to form a silicon layer, and the bond wafer is bonded to another wafer (base wafer) at room temperature. Here, a strong bond is formed by van der Waals' forces and hydrogen bond at room temperature. Further, a covalent bond is formed by heat treatment at 400° C. to 700° C., so that the bond gets stronger. The silicon layer bonded to the base wafer is separated from the bond wafer by heat treatment at about 500° C.

As an example of semiconductor devices using such an SOI substrate, the applicant has disclosed the device in Reference 1 (Japanese Published Patent Application No. 2000-012864).

SUMMARY OF THE INVENTION

Miniaturization has been main element of a technical development road map in a field of semiconductor integrated circuits, and thus, the field of the semiconductor integrated circuits has been developed. So far, as the semiconductor integrated circuits are miniaturized, higher speed operation can be realized, and thus low power consumption is achieved. Nowadays, a technique of manufacturing semiconductor integrated circuits with a design rule of 100 nm or less is coming to the practical stage. However, improvement in performance of semiconductor integrated circuits by miniaturization has a limit. Further, as miniaturization of a design rule advances, an ultrahigh-precision manufacturing apparatus is required and the amount of capital investment is increased more. Therefore, there is a limit from not only a technical perspective but also an economic perspective.

In view of the above, it is an object of the present invention to achieve high performance of a semiconductor integrated circuit depending on not only a microfabrication technique but also another way. It is another object of the present invention to achieve low power consumption of a semiconductor integrated circuit.

According to one aspect of a semiconductor device of the present invention, in a semiconductor integrated circuit, a crystal orientation of a single-crystalline semiconductor layer for forming a metal-insulator-semiconductor field effect transistor (hereinafter also referred to as an MISFET) having a first conductivity type is different from that of a single-crystalline semiconductor layer for forming a MISFET having a second conductivity type. The crystal orientation is such that mobility of carriers traveling in a channel length direction is increased in each of the MISFETs.

According to another aspect of a semiconductor device of the present invention, in a semiconductor integrated circuit, a crystal orientation and a crystal axis in a channel length direction of a single-crystalline semiconductor layer for forming a MISFET having a first conductivity type are different from those of a single-crystalline semiconductor layer for forming a MISFET having a second conductivity type.

According to another aspect of a semiconductor device of the present invention, in a semiconductor integrated circuit, crystal orientations of single-crystalline semiconductor layers for forming MISFETs are the same, and a crystal axis in a channel length direction of the single-crystalline semiconductor layer for forming a MISFET having a first conductivity type is different from that of the single-crystalline semiconductor layer for forming a MISFET having a second conductivity type.

A preferred mode of the above structure is a semiconductor device having a SOI structure in which a first single-crystalline semiconductor layer is formed over a substrate with a first insulating layer interposed therebetween by forming the first insulating layer over the first single-crystalline semiconductor layer and bonding the first insulating layer and the substrate to each other, and a second single-crystalline semiconductor layer is formed over the substrate with a second insulating layer interposed therebetween by forming the second insulating layer over the first single-crystalline semiconductor layer and bonding the second insulating layer and the second single-crystalline semiconductor layer to each other. In the semiconductor device of the present invention, the MISFET having the first conductivity type is manufactured using the first single-crystalline semiconductor layer, and the MISFET having the second conductivity type is manufactured using the second single-crystalline semiconductor layer. Note that in the semiconductor device of the present invention, the first single-crystalline semiconductor layer and the second single-crystalline semiconductor layer are bonded to the different insulating layers. A third insulating layer may be formed between the second insulating layer and the second single-crystalline semiconductor layer.

According to the present invention, by employing a crystal orientation or a crystal axis with which mobility of carriers flowing in a channel of a MISFET is increased, a semiconductor integrated circuit can be operated at higher speed. Further, low voltage driving becomes possible, and low power consumption can be achieved. In other words, the possibility of carriers flowing in the channel of the MISFET scattered by atoms can be reduced, whereby resistance which electrons and holes meet with can be reduced, and performance of the MISFET can be improved.

In addition, when single-crystalline semiconductor layers having different crystal orientations are bonded to a substrate, the single-crystalline semiconductor layers are formed over different flat insulating layers; therefore, the insulating layers and the single-crystalline semiconductor layers can be easily bonded to each other. Further, since the single-crystalline semiconductor layers which form MISFETs having different conductivity types are formed over the different insulating layers, parasitic capacitance between the single-crystalline semiconductor layers of the MISFETs having different conductivity types, or parasitic capacitance between the gate electrodes of the MISFETs having different conductivity

DETAILED DESCRIPTION OF THE INVENTION

Figure 1A:
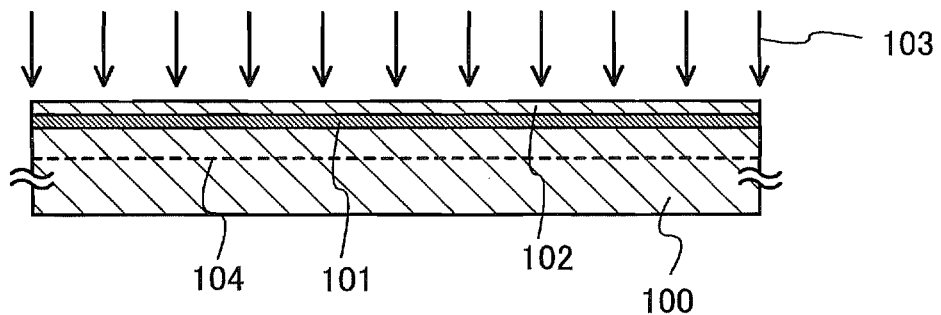
FIGS. 1A to 1C illustrate manufacturing steps of a semiconductor device.

Hereinafter, embodiment modes of the present invention will be described with reference to the accompanying drawings. Note that the present invention is not limited to the following description, and it is easily understood by those skilled in the art that modes and details thereof can be modified in various ways without departing from the spirit and the scope of the invention. Therefore, the present invention should not be interpreted as being limited to the following description of the embodiment modes. In a structure of the present invention to be given below, the same portions or portions having similar functions may be denoted by the same reference numerals in different drawings.

Embodiment Mode 1

This embodiment mode will describe a mode of transferring semiconductor layers which form an n-channel MISFET and a p-channel MISFET from single-crystalline semiconductor substrates having different crystal orientations (hereinafter also referred to as bond wafers) to another substrate (hereinafter also referred to as a base substrate). In addition, a structural example of a CMOS circuit will be explained as an example of semiconductor devices using such a substrate. The following will describe a mode in which a crystal orientation with which mobility of carriers moving in a channel length direction is increased is employed for each of the n-channel MISFET and the p-channel MISFET, that is, a mode in which a semiconductor layer whose plane orientation is {100} is employed for the n-channel MISFET and a semiconductor layer whose plane orientation is {110} is employed for the p-channel MISFET.

First, a silicon oxynitride film 101 and a silicon nitride oxide film 102 are formed in order over a first bond wafer 100 (FIG. 1A). As the first bond wafer 100, a single-crystalline semiconductor substrate whose crystal orientation is {100} is selected. As the single-crystalline semiconductor substrate, single-crystalline silicon can be used, for example. In addition, silicon which can be separated from a polycrystalline semiconductor substrate, or germanium which can be separated from a single-crystalline semiconductor substrate or a polycrystalline semiconductor substrate can be used. Further, a crystalline semiconductor substrate which is formed of a compound semiconductor such as silicon germanium, gallium arsenide, or indium phosphide can be used. The thickness of the silicon oxynitride film 101 is preferably 10 nm or more and 150 nm or less. Further, the thickness of the silicon nitride oxide film 102 is preferably 10 nm or more and 200 nm or less.

The silicon oxynitride film 101 and the silicon nitride oxide film 102 are provided to prevent contamination of a single-crystalline semiconductor layer due to impurities such as sodium ions diffused from a base substrate 106. Note that the silicon nitride oxide film means a film that contains more nitrogen than oxygen and, in the case where measurements are performed using Rutherford backscattering spectrometry (RBS) and hydrogen forward scattering (HFS), includes oxygen, nitrogen, silicon, and hydrogen at concentrations ranging from 5 at. % to 30 at. %, 20 at. % to 55 at. %, 25 at. % to 35 at. %, and 10 at. % to 30 at. %, respectively. Further, the silicon oxynitride film means a film that contains more oxygen than nitrogen and, in the case where measurements are performed using RBS and HFS, includes oxygen, nitrogen, silicon, and hydrogen at concentrations ranging from 50 at. % to 70 at. %, 0.5 at. % to 15 at. %, 25 at. % to 35 at. %, and 0.1 at. % to 10 at. %, respectively. Note that percentages of nitrogen, oxygen, silicon, and hydrogen fall within the ranges given above, where the total number of atoms contained in the silicon oxynitride film or the silicon nitride oxide film is defined as 100 at. %. Aluminum nitride, aluminum nitride oxide, or the like may also be used. The silicon oxynitride film 101 and the silicon nitride oxide film 102 are not necessarily provided, and a substrate in which a brittle layer is formed by performing ion irradiation to a single-crystalline semiconductor substrate may also be used.

Then, the first bond wafer 100 is irradiated with hydrogen ions 103 which are obtained by ionizing a hydrogen gas, so that a brittle layer 104 is formed (FIG. 1A). Here, irradiation with the hydrogen ions is performed in consideration of the thickness of the single-crystalline semiconductor layer to be transferred to the base substrate. The thickness of the single-crystalline semiconductor layer is set at 10 nm to 200 nm, preferably 10 nm to 50 nm. The acceleration voltage in irradiation with the hydrogen ions is determined in consideration of such a thickness, so that the hydrogen ions are added at a deep part of the first bond wafer 100. By this processing, the brittle layer 104 is formed in a region at a certain depth from the surface of the first bond wafer 100. The irradiation with the hydrogen ions may be performed by so-called ion doping using hydrogen as a source gas without separating hydrogen by mass. This brittle layer 104 may be formed using hydrogen ions including not only $H^+$ ions but also one or more of $H_2^+$, $H_3^+$, and $H_4^+$ ions. In addition, not only hydrogen but also a rare gas may be used, or a mixture of hydrogen and a rare gas may be used.

Figure 1B:
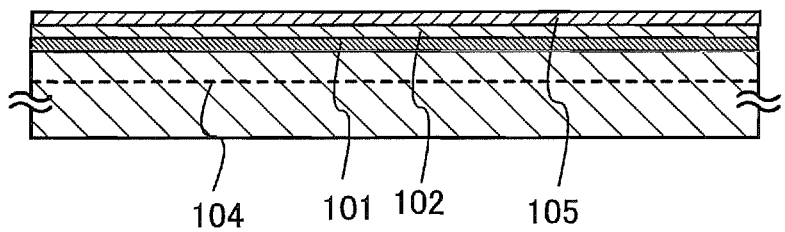

Then, a silicon oxide film 105 is formed over the silicon nitride oxide film 102 by a chemical vapor deposition (CVD) method or a plasma chemical vapor deposition (plasma CVD) method using a mixed gas of a TEOS gas and an oxygen gas (FIG. 1B). Note that the silicon oxide film 105 may also be formed before performing ion irradiation to the first bond wafer 100. Note that when a silicon oxide film is formed by a CVD method or a plasma CVD method that uses a mixed gas of a TEOS gas and an oxygen gas, it is preferable that the film be formed at a thickness of 10 nm or more and 800 nm or less.

Here, "TEOS gas" refers to a tetraethyl orthosilicate gas. By provision of a silicon oxide film formed by a CVD method or a plasma CVD method that uses a mixed gas of a TEOS gas and an oxygen gas at the bonding interface of a bond wafer and a base substrate, adherence of the substrates can be increased even more.

When irradiation with hydrogen ions is performed before formation of the silicon oxynitride film 101 and the silicon nitride oxide film 102 over the first bond wafer 100 or without formation of the silicon oxynitride film 101 and the silicon nitride oxide film 102, it is preferable that a natural oxide film, a chemical oxide, or an ultra-thin oxide film formed by irradiation with UV light in an atmosphere containing oxygen be formed over the surface of the first bond wafer 100. Here, a chemical oxide can be formed by treatment of the surface of the bond wafer with oxidizer such as ozone water, a solution of hydrogen peroxide, or sulfuric acid. By formation of an oxide film over the bond wafer, surface roughness due to etching of the surface of the bond wafer in the introduction of hydrogen to be performed later can be prevented.

Figure 1C:
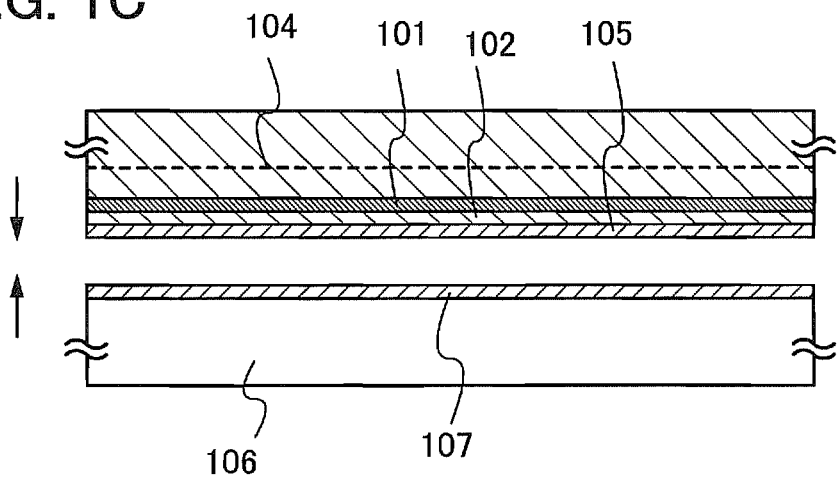

Then, as illustrated in FIG. 1C, the silicon oxide film 105 formed over the first bond wafer 100 and the base substrate 106 are bonded to each other. Note that a silicon oxide film 107 is formed over the surface of the base substrate 106 by a CVD method or a plasma CVD method using a mixed gas of a TEOS gas and an oxygen gas. By bonding the silicon oxide films 105 and 107 to each other, the first bond wafer 100 and the base substrate 106 can be bonded to each other. Note that the silicon oxide film 107 is not necessarily formed but is preferably provided in order to improve adherence of the substrates.

Since bonding at low temperature is possible, various substrates can be employed as the base substrate 106. As the base substrate 106, an insulating substrate of glass, quartz, sapphire, or the like; a semiconductor substrate of silicon, gallium arsenide, indium phosphide, or the like; or the like can be used.

In this embodiment mode, the bond is performed by disposing the silicon oxide film 105 over the first bond wafer 100 and the silicon oxide film 107 over the base substrate 106 in close contact with each other. The bond can be formed at room temperature. This bonding is carried out at the atomic level, and the bond can be formed at room temperature by van der Waals' forces or hydrogen bond.

Figure 2A:
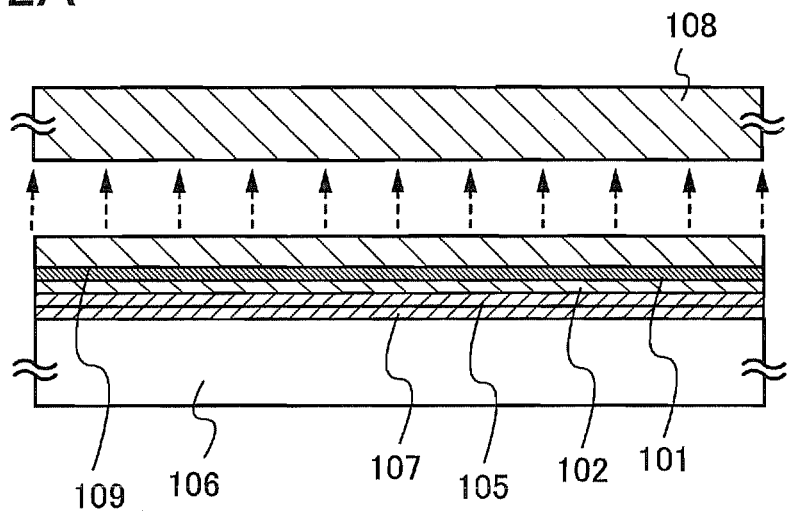
FIGS. 2A to 2C illustrate manufacturing steps of a semiconductor device.
Figure 2B:
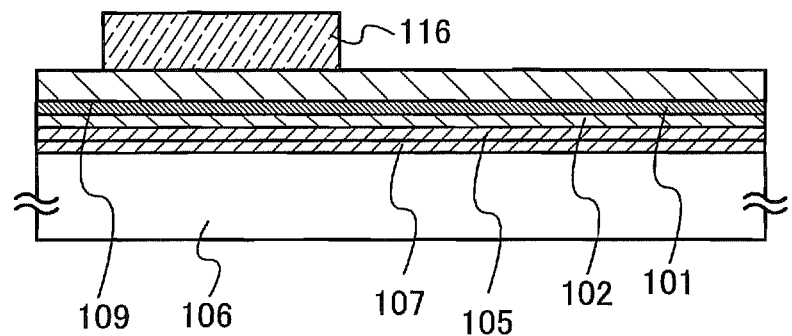

Next, after the first bond wafer 100 and the base substrate 106 are bonded to each other, heat treatment is performed at 400° C. to 700° C., so that a single-crystalline semiconductor layer 108 which is part of the first bond wafer 100 is separated (FIG. 2A). Through this heat treatment, the volumes of microvoids which are formed in the brittle layer 104 are changed, and a ruptured section is generated along the brittle layer 104. Thus, the single-crystalline semiconductor layer 108 can be separated along the ruptured section. In addition, by this heat treatment, the bond can be further stronger. Accordingly, a thin single-crystalline semiconductor layer 109 is formed over the base substrate 106 (FIG. 2B).

Figure 2C:
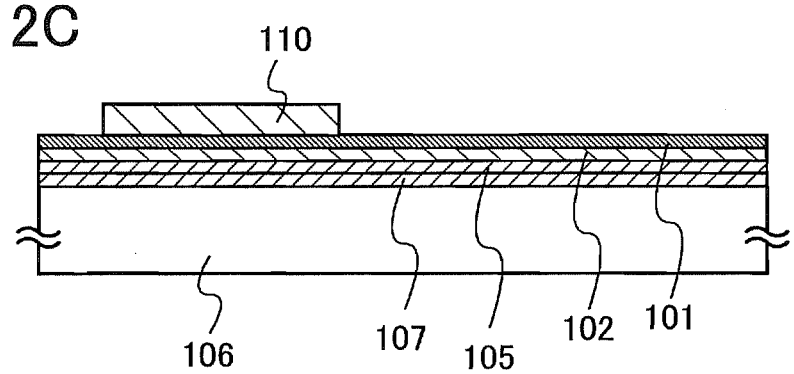

Next, a resist 116 is formed over the single-crystalline semiconductor layer 109 as selected. By etching the single-crystalline semiconductor layer 109 using the resist 116 as a mask, an island-shaped single-crystalline semiconductor layer (hereinafter also referred to as a first SOI layer) 110 is formed (FIG. 2C).

Figure 3A:
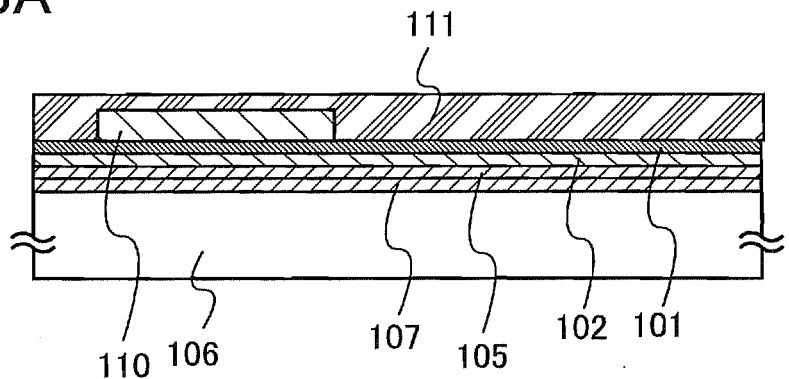
FIGS. 3A to 3C illustrate manufacturing steps of a semiconductor device.

Next, an insulating layer 111 is formed over the island-shaped single-crystalline semiconductor layer 110 and the silicon oxynitride film 101 (FIG. 3A). The insulating layer 111 is preferably formed using an oxide film so as to have a thickness such that the surface thereof is flattened. The surface of the oxide film may be flattened by chemical mechanical polishing (CMP). For example, a silicon oxide film formed by a CVD method or a plasma CVD method using a mixed gas of a TEOS gas and an oxygen gas, a silicon oxynitride film formed by a thermal CVD method, a silicon nitride oxide film formed by a thermal CVD method, or the like can be used. Before the insulating layer 111 is formed, a natural oxide film, a chemical oxide, or an ultra thin oxide film formed by irradiation with UV light in an atmosphere containing oxygen may be formed over the surface of the single-crystalline semiconductor layer 110. A chemical oxide can be formed by treating the surface of the single-crystalline semiconductor layer with oxidizer such as ozone water, a solution of hydrogen peroxide, or sulfuric acid.

Figure 3B:
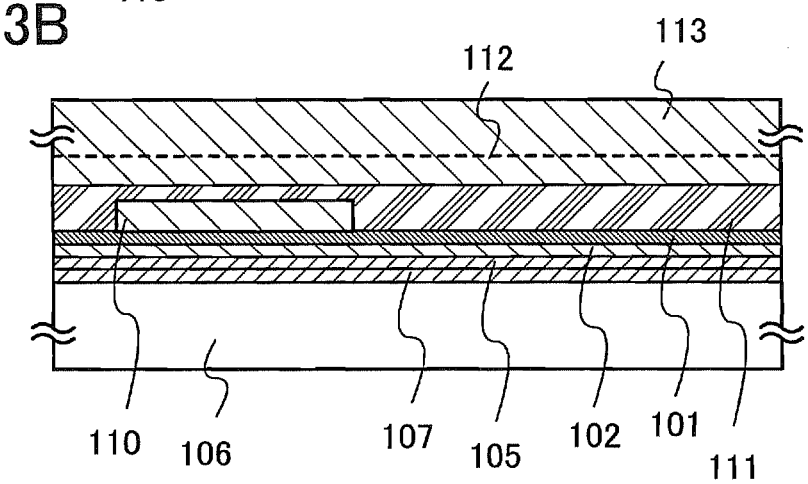

Next, the insulating layer 111 and a second bond wafer 113 in which a brittle layer 112 is formed are bonded to each other (FIG. 3B). The second bond wafer 113 can be formed by performing ion irradiation to a single-crystalline semiconductor substrate as in the case of the first bond wafer 100. A single-crystalline semiconductor substrate whose crystal orientation is {110} is selected as the second bond wafer 113. Note that the crystal orientations of the first bond wafer 100 and the second bond wafer 113 are not limited to the combination of this embodiment mode. For example, a substrate whose crystal orientation is {110} may be used as the first bond wafer 100, and a substrate whose crystal orientation is {100} may be used as the second bond wafer 113. In that case, preferably, a p-channel MISFET is manufactured using the first bond wafer 100 and an n-channel MISFET is manufactured using the second bond wafer 113. It is necessary that the substrate whose crystal orientation is {110} is irradiated with more ions than the substrate whose crystal orientation is {100} in ion irradiation.

Figure 3C:
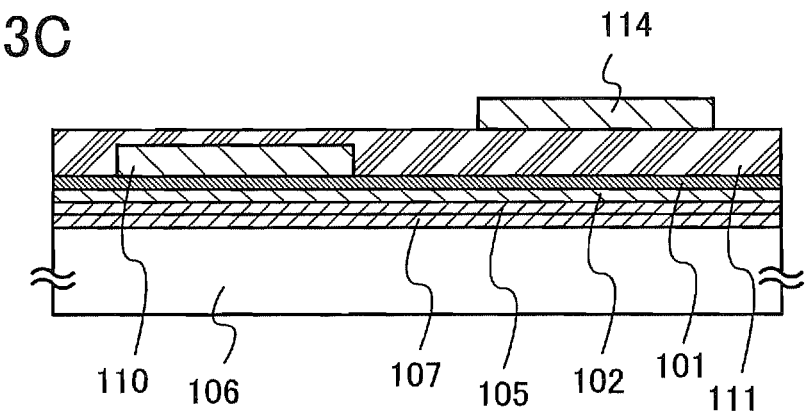

Then, heat treatment is performed, and a single-crystalline semiconductor layer is separated from the second bond wafer, whereby a thin single-crystalline semiconductor layer can be formed over the insulating layer 111 (FIG. 3B). After that, the thin single-crystalline semiconductor layer is etched as selected, so that an island-shaped single-crystalline semiconductor layer (hereinafter also referred to as a second SOI layer) 114 is formed over the insulating layer 111 (FIG. 3C).

Through the above-described process, the base substrate 106 can be formed, over which the first SOI layer 110 and the second SOI layer 114 having different crystal orientations from each other are provided over the different insulating layers. In the above process, when a crystal orientation of the first bond wafer 100 is {100}, a crystal orientation of the first SOI layer 110 is also {100}, and when a crystal orientation of the second bond wafer 113 is {110}, a crystal orientation of the second SOI layer 114 is also {114}. In order to flatten the surfaces of the first SOI layer 110 and the second SOI layer 114 which are transferred, chemical mechanical polishing (CMP) may be performed. The first SOI layer 110 and the second SOI layer 114 may be further thinned by CMP, and may be adjusted to be 10 nm to 50 nm thick.

Figure 4A:
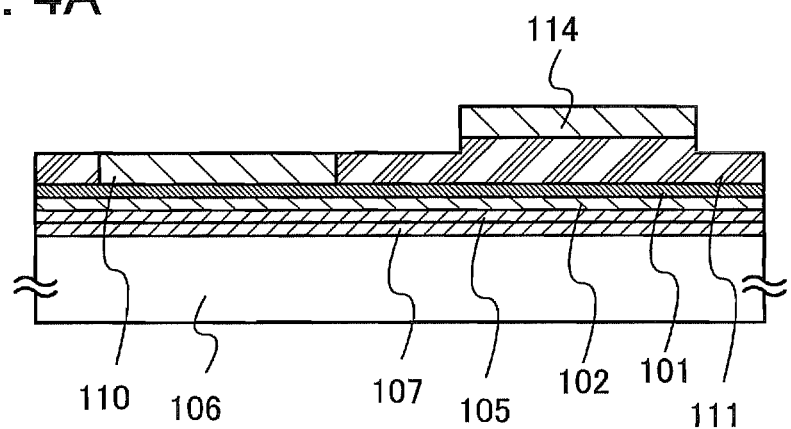
FIGS. 4A and 4B illustrate manufacturing steps of a semiconductor device.
Figure 4B:
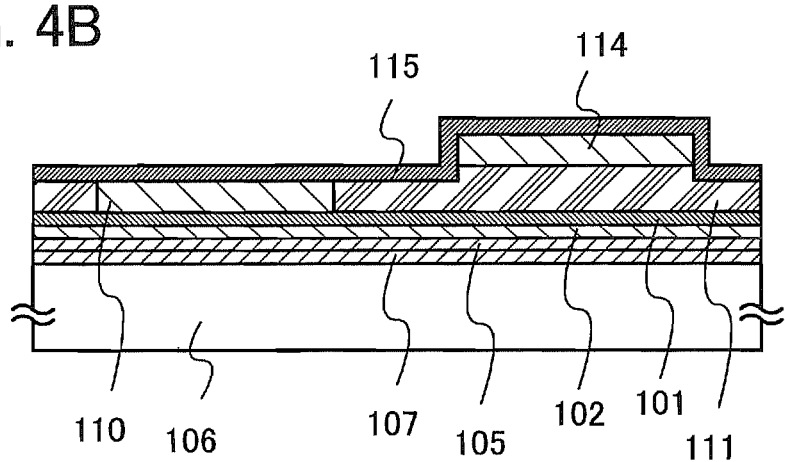

Next, the insulating layer 111 is removed as selected to expose the surface of the first SOT layer 110 (FIG. 4A). The insulating layer 111 is not necessarily removed at this time, but is preferably removed so that a gate insulating layer which is formed later over the first SOI layer 110 and the second SOI layer 114 has a uniform thickness. After that, an insulating layer 115 is formed as a gate insulating layer to cover the first SOI layer 110 and the second SOI layer 114 (FIG. 4B). For the insulating layer 115, a material such as silicon oxide, silicon oxynitride, silicon nitride oxide, hafnium oxide (HfO$_x$), aluminium oxide (Al$_x$O$_y$ where x>y>0), or tantalum oxide (Ta$_x$O$_y$ where x>y>0) can be used.

The following will explain an example of a process for manufacturing an inverter circuit as a structural example of a CMOS circuit. Various integrated circuits such as a microprocessor can be formed, not limited to the inverter circuit. FIGS. 5A, 6A, 7A, 8A, 9A, 10A, and 11A illustrate top views of the inverter circuit, and FIGS. 5B, 6B, 7B, 8B, 9B, 10B, and 11B illustrate cross-sectional views of the inverter circuit taken along lines A-B in FIGS. 5A, 6A, 7A, 8A, 9A, 10A, and 11A, respectively.

Figure 5A:
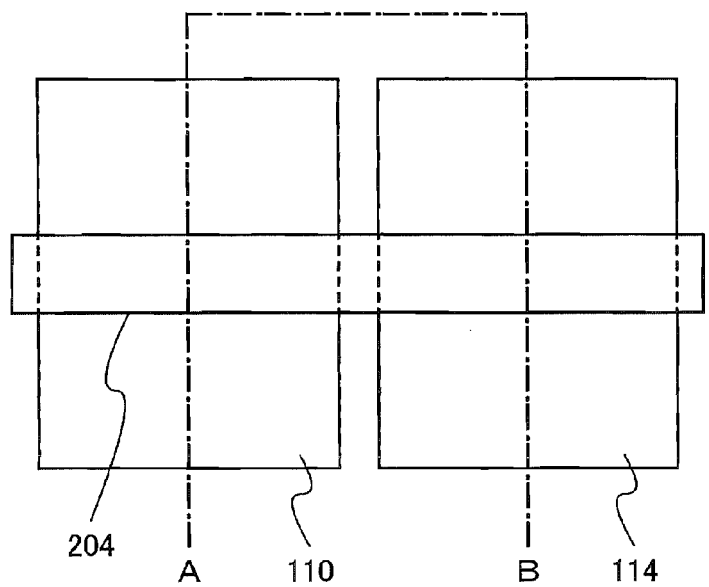
FIGS. 5A and 5B illustrate a manufacturing step of a semiconductor device.
Figure 5B:
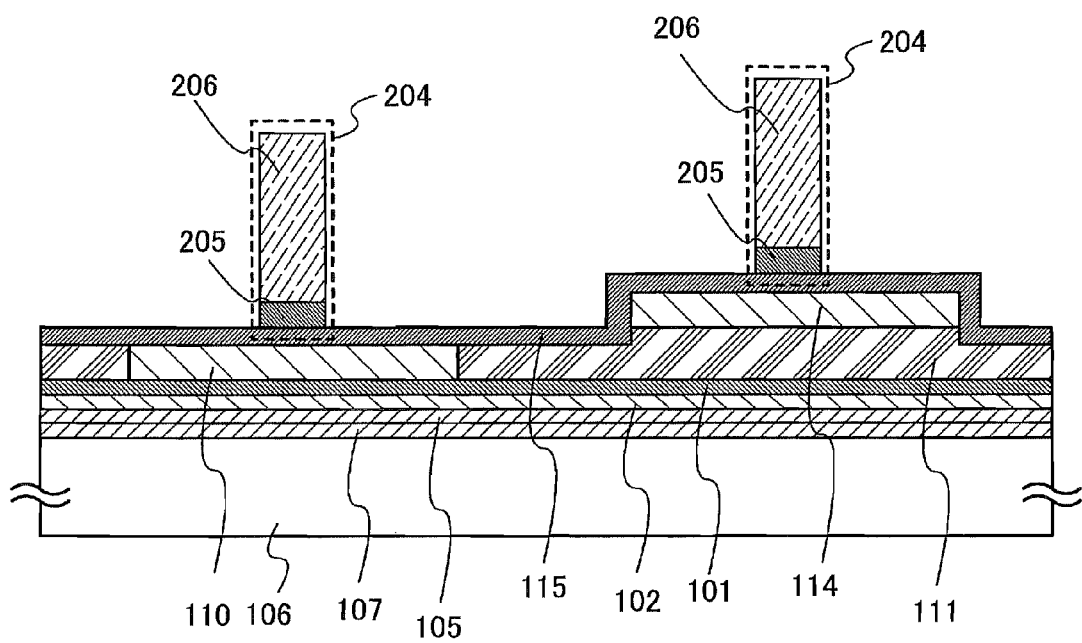

As illustrated in FIGS. 5A and 5B, a conductive layer (also referred to as a gate electrode) 204 serving as a gate electrode is formed over the first SOI layer 110 and the second SOI layer 114 with the insulating layer 115 serving as a gate insulating layer interposed therebetween. Here, the conductive layer 204 is formed over the first SOI layer 110 and the second SOI layer 114. In this embodiment mode, the conductive layer 204 serving as a gate electrode is formed by stacking a conductive layer (also referred to as a first electrode layer) 205 and a conductive layer (also referred to as a second electrode layer) 206.

In the case of using a high dielectric material (high-k material) for the insulating layer 115, the gate electrode 204 may be formed using polycrystalline silicon, silicide, metal, or metal nitride. Preferably, the gate electrode 204 is formed using metal or metal nitride. For example, the first gate electrode layer 205 in contact with the insulating layer 115 is formed using a metal nitride material, and the second gate electrode layer 206 thereover is formed using a metal material. This combination can prevent spread of a depletion layer in the gate electrode even when the gate insulating layer is thinned and can also prevent reduction in driving capability of the transistors even in the case of miniaturization.

Figure 6A:
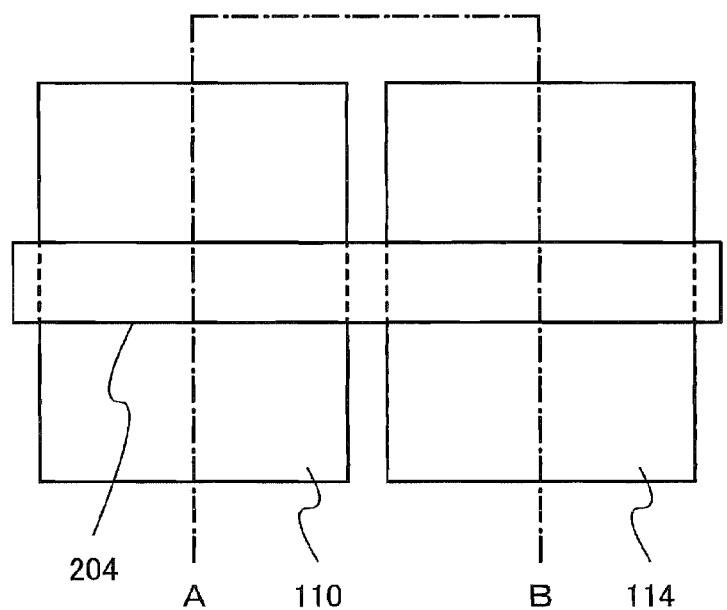
FIGS. 6A and 6B illustrate a manufacturing step of a semiconductor device.
Figure 6B:
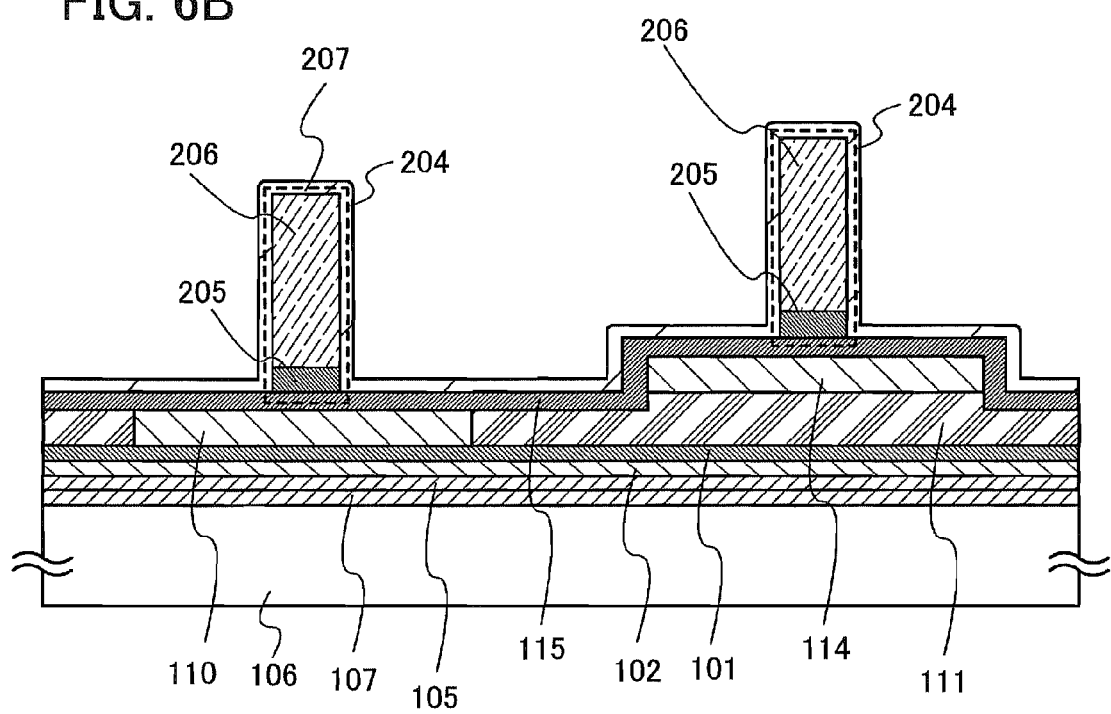

Then, a first insulating layer 207 is formed over the gate electrode 204 (FIGS. 6A and 6B). The first insulating layer 207 is formed using a silicon oxide film or a silicon oxynitride film. As another mode, the gate electrode 204 may be insulated by oxidation or nitridation treatment to form a similar layer. The first insulating layer 207 is formed with a thickness of 1 nm to 10 nm also on the side surfaces of the gate electrode 204. The first insulating layer 207 is formed in order to form an offset region, to which impurities for valence electron control are not added, in the first SOI layer 110 and the second SOI layer 114 in a later process.

Figure 7A:
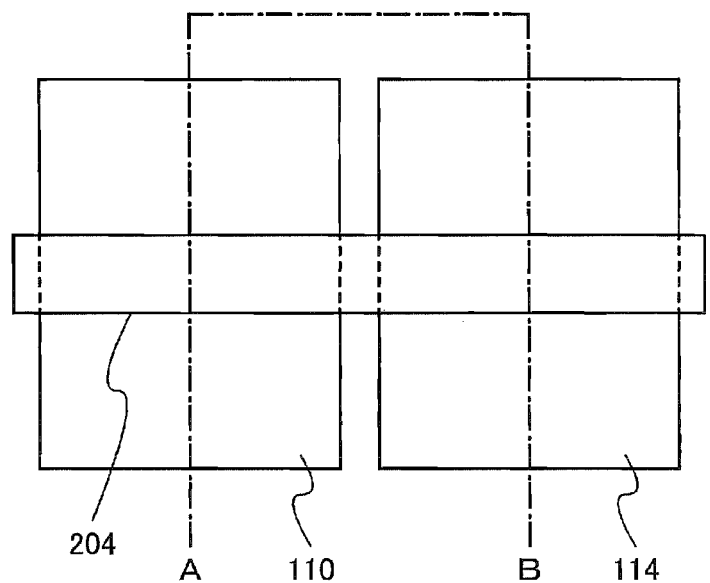
FIGS. 7A and 7B illustrate a manufacturing step of a semiconductor device.
Figure 7B:
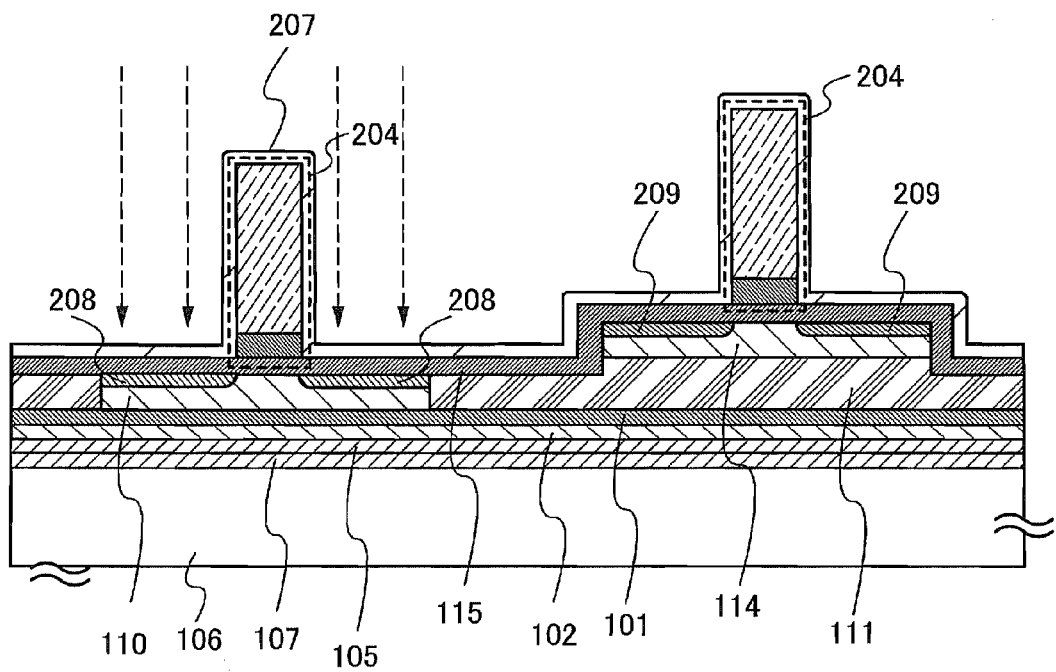

FIGS. 7A and 7B illustrate a step of forming ultrashallow junctions (source/drain extensions) in the first SOI layer 110 and the second SOI layer 114. These ultrashallow junctions are preferably provided to suppress a short channel effect. To the first SOI layer 110 for an n-channel MISFET, a Group 13 element is added to form first ultrashallow junctions 208. To the second SOI layer 114 for a p-channel MISFET, a Group 15 element is added to form second ultrashallow junctions 209. The impurity concentration of these ultrashallow junctions is set to have the number of digits which is larger than that of a low-concentration drain by one. For example, the first ultrashallow junctions 208 are formed by ion implantation of phosphorus at 15 keV with a dose of $2\times10^{14}$/cm$^2$. The second ultrashallow junctions 209 are formed by ion implantation of boron at 15 keV with a dose of $3\times10^{13}$/cm$^2$.

Figure 8A:
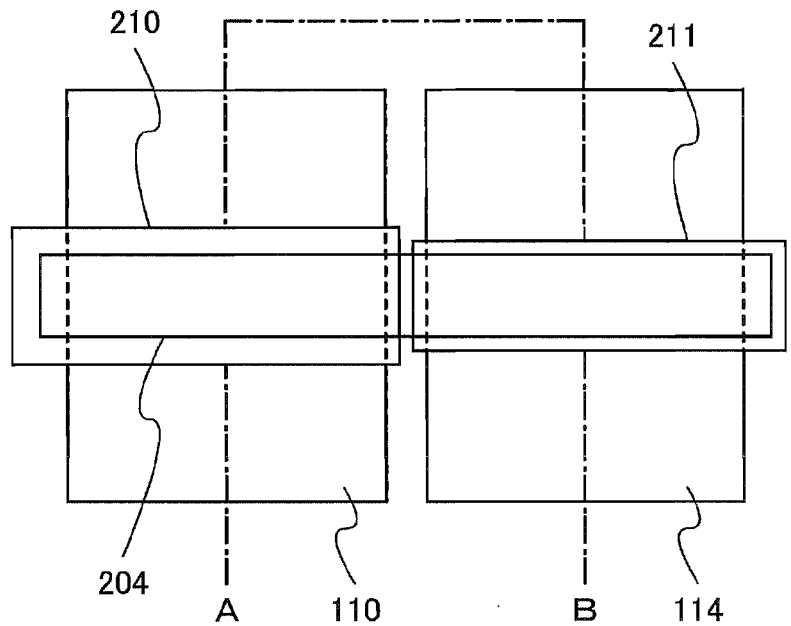
FIGS. 8A and 8B illustrate a manufacturing step of a semiconductor device.
Figure 8B:
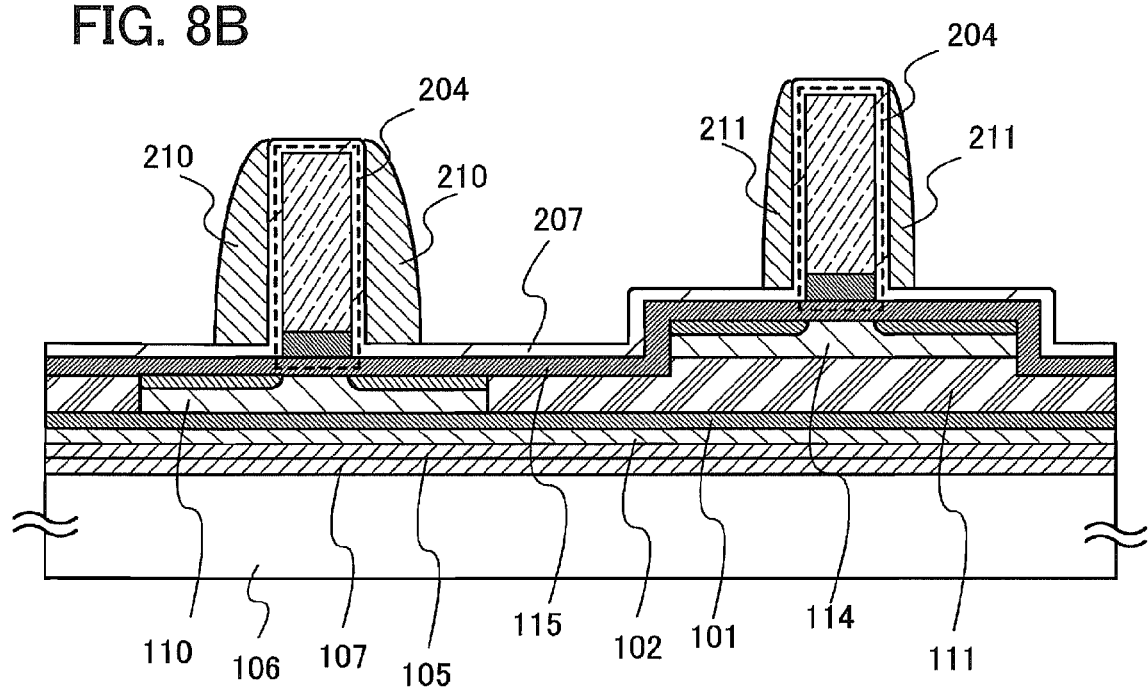

Next, as illustrated in FIGS. 8A and 8B, first sidewalls 210 and second sidewalls 211 are formed on the side surfaces of the gate electrode 204. For example, the first sidewalls 210 and the second sidewalls 211 are formed using a silicon nitride film. These sidewalls are formed in a self-alignment manner by anisotropic etching.

In this case, the first sidewalls 210 on the first SOI layer 110 side and the second sidewalls 211 on the second SOI layer 114 side may be processed to have the same width, but are preferably processed to have different widths. The width of the second sidewalls 211 on the side of the second SOI layer 114 for the p-channel MISFET is preferably smaller than the width of the first sidewalls 210 on the side of the first SOT layer 110 for the n-channel MISFET. This is because boron added to form a source region and a drain region in the p-channel MISFET is likely to diffuse and tends to induce a short channel effect. This structure allows boron to be added to the source region and the drain region at a high concentration and can decrease resistance of the source region and the drain region in the p-channel MISFET.

Figure 9A:
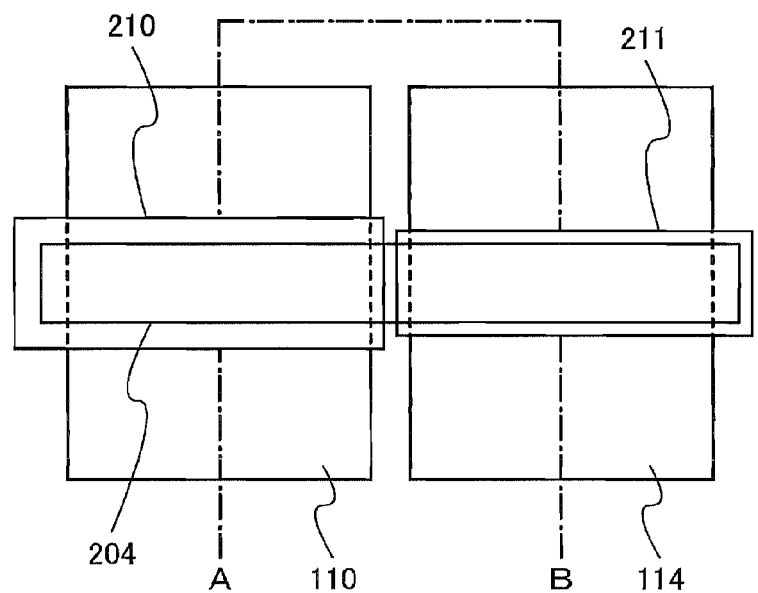
FIGS. 9A and 9B illustrate a manufacturing step of a semiconductor device.
Figure 9B:
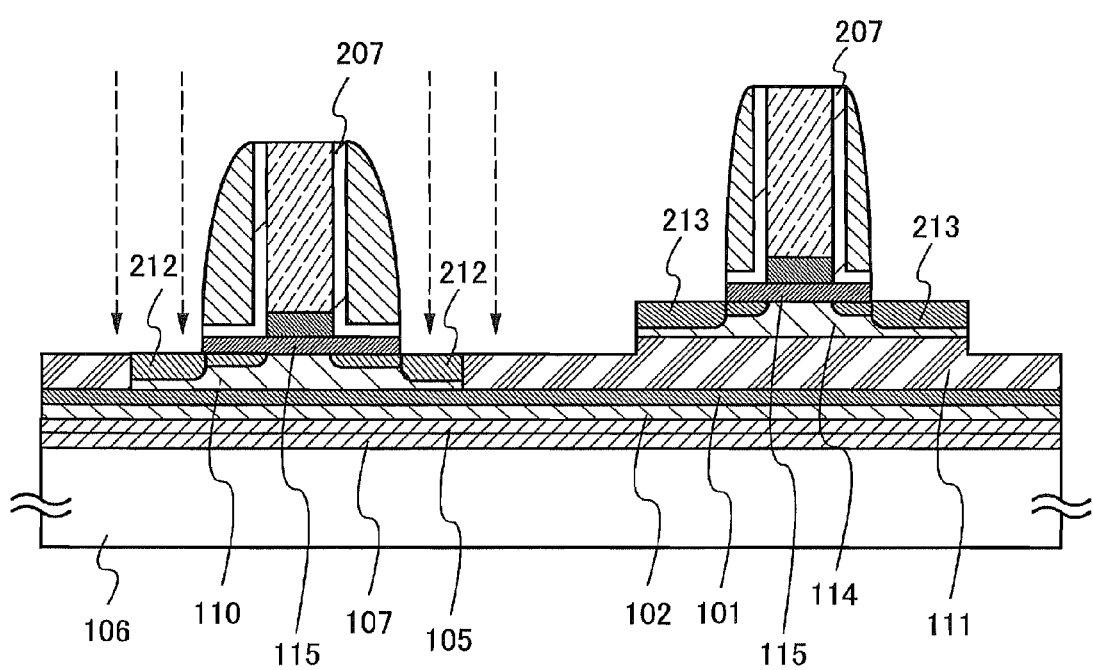

After forming the sidewalls, exposed parts of the first insulating layer 207 and the insulating layer 115 formed below the first insulating layer 207 are etched as illustrated in FIGS. 9A and 9B. Then, a source region and a drain region are formed in a self-alignment manner. This step can be carried out by an ion implantation method in which impurity ions for valence electron control are accelerated by electric field and added. A Group 15 element is added to the first SOI layer 110 to form first impurity regions 212 to be a source region and a drain region. A Group 13 element is added to the second SOT layer 114 to form second impurity regions 213 to be a source region and a drain region. For example, phosphorus ions are implanted to the first SOI layer 110 for the n-channel MISFET at 50 keV with a dose of $5\times10^{15}$/cm$^2$, and boron ions are implanted to the second SOI layer 114 for the p-channel MISFET at 30 keV with a dose of $3\times10^{15}$/cm$^2$. The doping conditions such as ion species, the acceleration voltage, and the dose may be set as appropriate.

In order to further decrease resistance of the source region and the drain region, a silicide layer may be formed. As the silicide layer, cobalt silicide or nickel silicide may be employed. When the SOI layer is thin, silicide reaction may be made to proceed to the bottom part of the SOI layer in that region, so that silicide may be formed in the entire region.

Figure 10A:
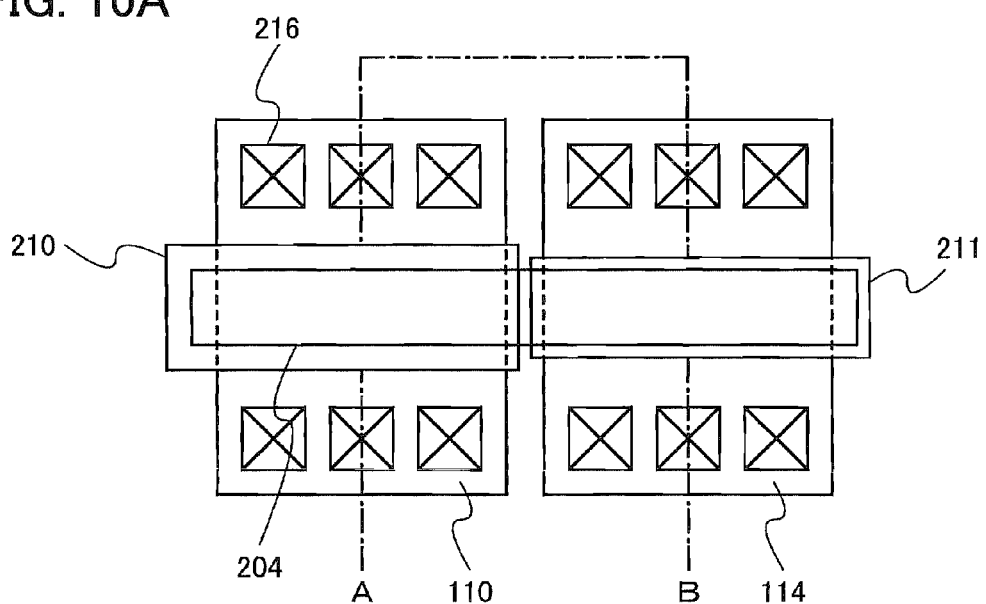
FIGS. 10A and 10B illustrate a manufacturing step of a semiconductor device.
Figure 10B:
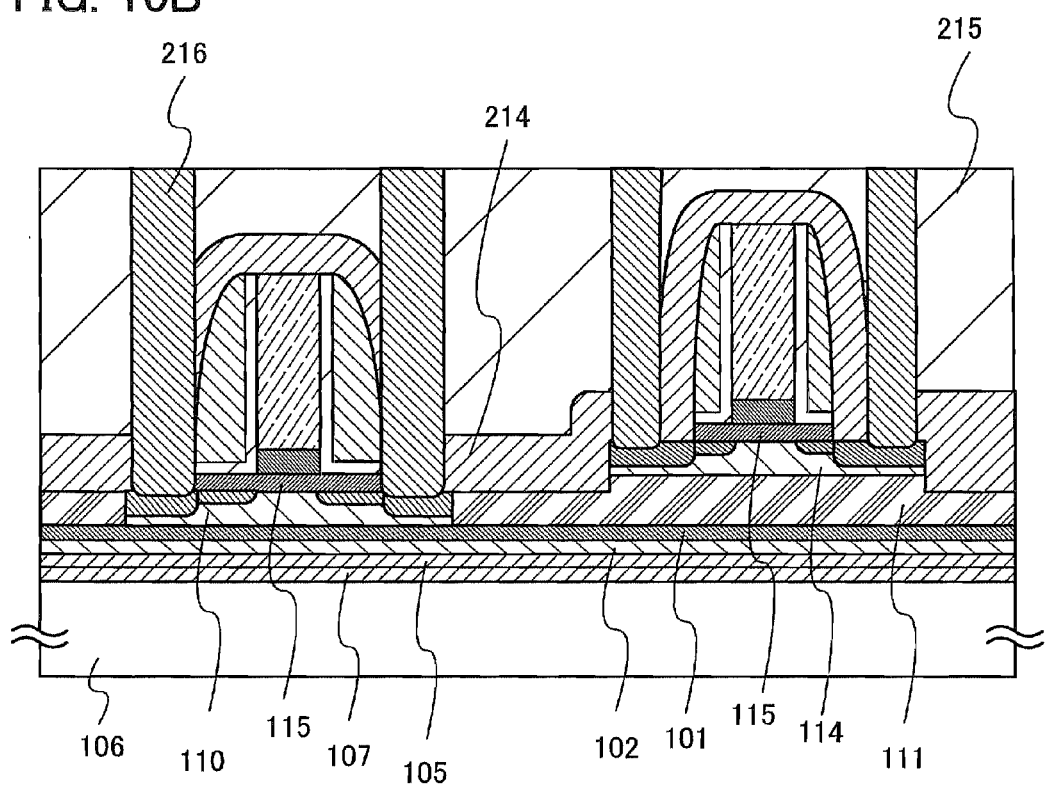

FIGS. 10A and 10B illustrate a step of forming a passivation layer 214, a first interlayer insulating layer 215, and contact plugs 216. The passivation layer 214 is formed over the entire surface by a CVD method using a silicon nitride film, a silicon nitride oxide film, or the like. The first interlayer insulating layer 215 is formed using phosphosilicate glass (PSG) or borophosphosilicate glass (BPSG) by a CVD method and flattened by reflow. Alternatively, a silicon oxide film may be formed using tetraethoxysilane (tetra-ethyl-ortho-silicate, $Si(OCH_2CH_3)_4$) by a CVD method and then be flattened by CMP. The contact plugs 216 are formed of tungsten silicide so as to fill contact holes which are formed in the first interlayer insulating layer 215. Tungsten silicide is formed by a CVD method using tungsten hexafluoride ($WF_6$) and silane ($SiH_4$).

Figure 11A:
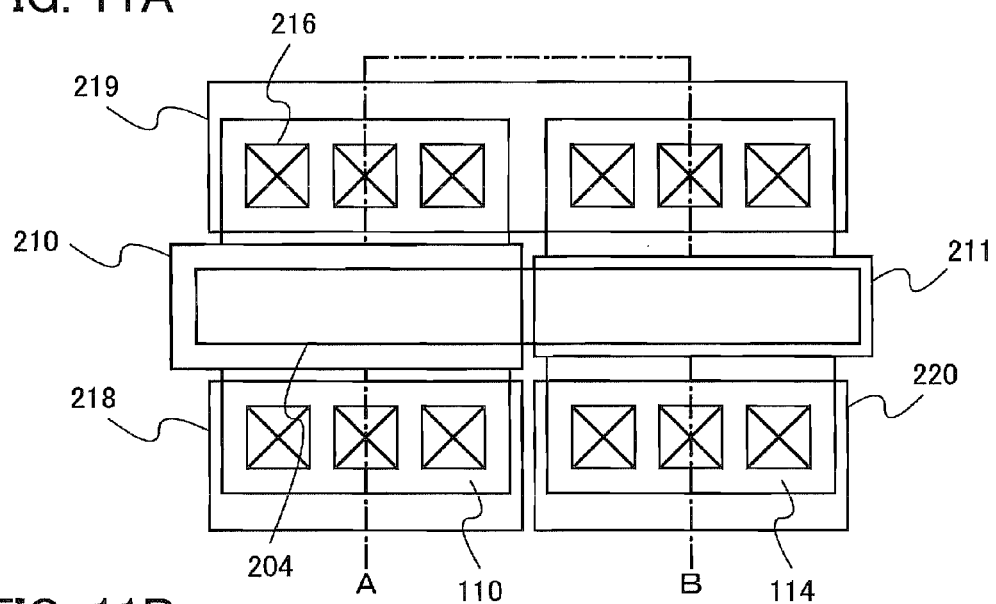
FIGS. 11A and 11B illustrate a manufacturing step of a semiconductor device.
Figure 11B:
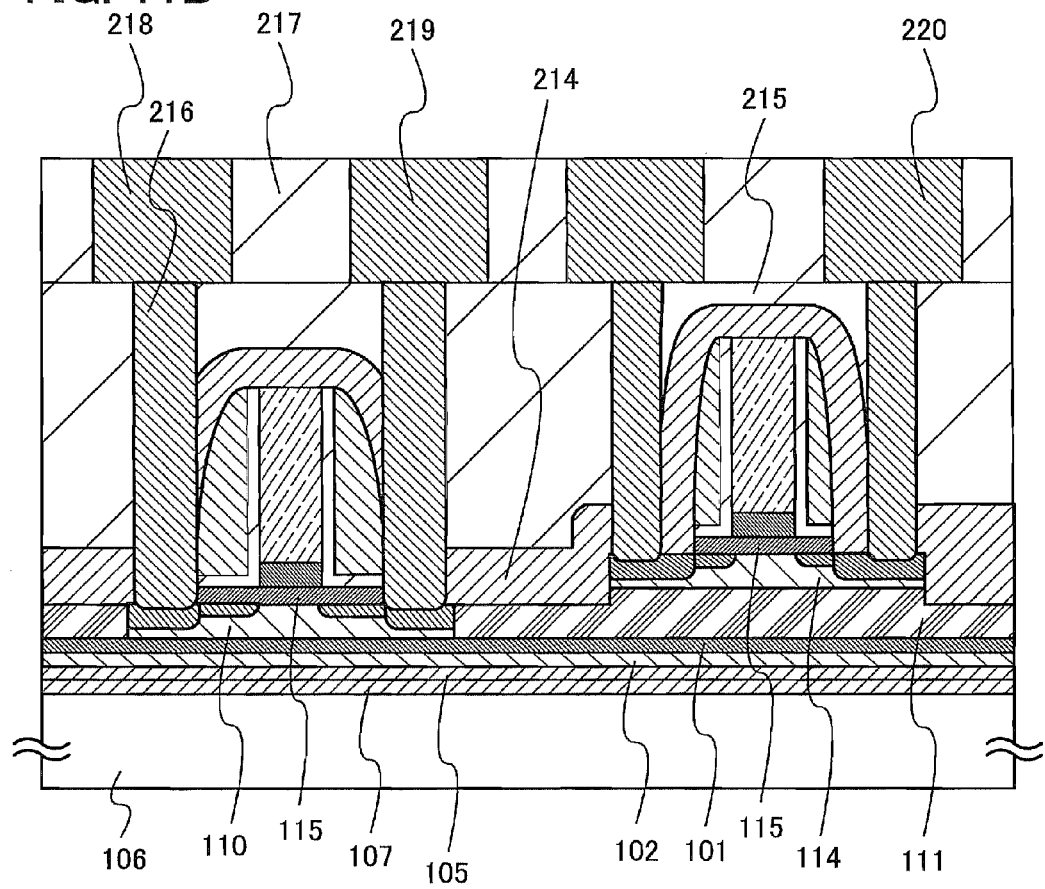

A multilayer structure of a wiring is employed depending on the structure of the semiconductor device. FIGS. 11A and 11B illustrate a structure in which a second interlayer insulating layer 217, a first wiring 218, a second wiring 219, and a third wiring 220 are provided over the first interlayer insulating layer 215. These wirings may be formed using tungsten silicide or may be formed using Cu wirings by a damascene method.

FIGS. 12A to 13B illustrate examples of preferable combinations of crystal orientations and crystal axes of the p-channel MISFET and the n-channel MISFET.

Figure 12A:
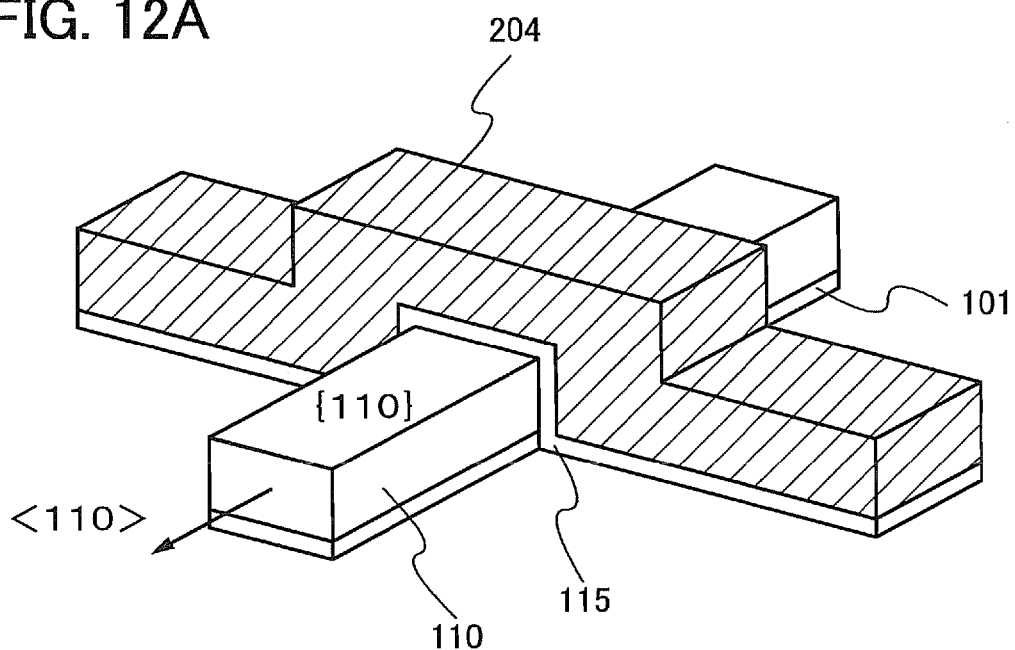
FIGS. 12A and 12B illustrate an example of a preferable combination of crystal orientations of SOI layers for a p-channel MISFET and an n-channel MISFET.
Figure 12B:
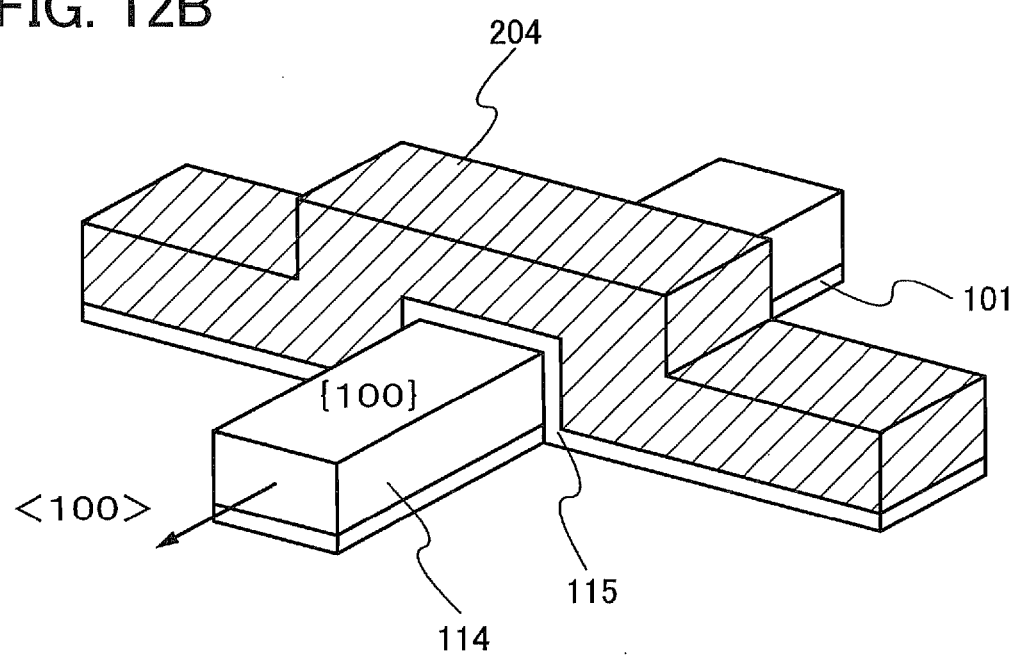

FIGS. 12A and 12B illustrate the case where crystal orientations of the SOI layers for forming the p-channel MISFET and the n-channel MISFET are different. FIG. 12A illustrates the p-channel MISFET, and the SOI layer whose plane orientation is {110} is used. At this time, a more preferred mode is that a crystal axis in a channel length direction is <110>. FIG. 12B illustrates the n-channel MISFET, and the SOI layer whose plane orientation is {100} is used. At this time, a more preferred mode is that a crystal axis in a channel length direction is <100>. With the above-described combination, field effect mobility of holes and electrons can be increased.

Figure 13A:
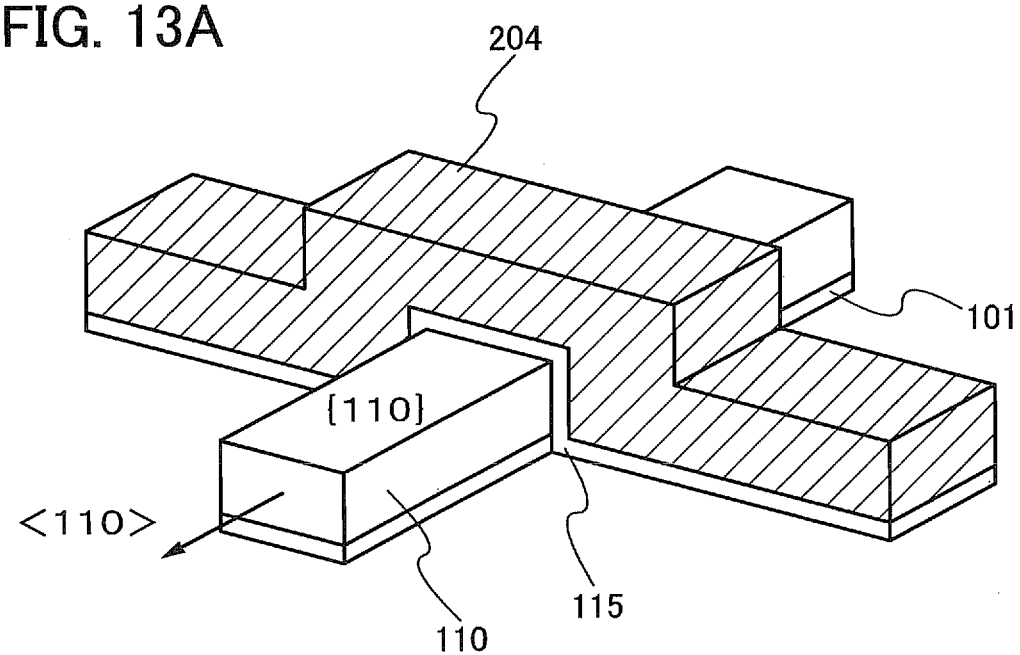
FIGS. 13A and 13B illustrate an example of a preferable combination of crystal orientations of SOI layers for a p-channel MISFET and an n-channel MISFET.
Figure 13B:
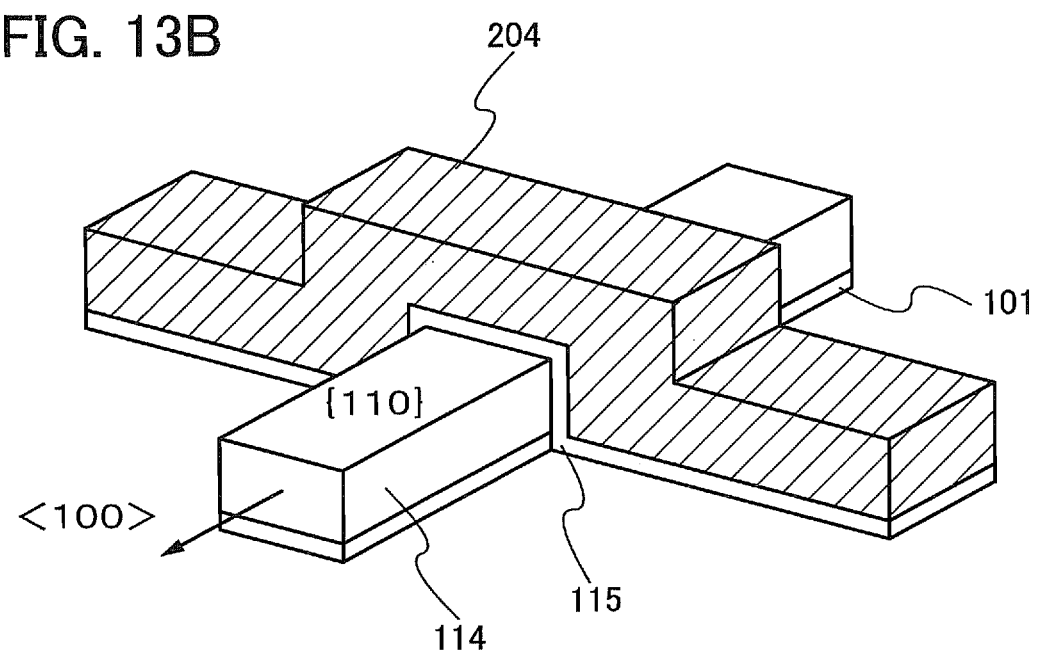

Note that crystal orientations of the SOI layers which form the p-channel MISFET and the n-channel MISFET are not necessarily different from each other. FIGS. 13A and 13B illustrate the case where crystal orientations of the SOI layers for the p-channel MISFET and the n-channel MISFET are the same. FIG. 13A illustrates the p-channel MISFET, and the SOI layer whose plane orientation plane orientation {110} is used. At this time, a more preferred mode is that a crystal axis in a channel length direction is <110>. FIG. 13B illustrates the n-channel MISFET, and the SOI layer whose plane orientation plane orientation {110} is used. At this time, a more preferred mode is that a crystal axis in a channel length direction is <100>. With the above-described combination, field effect mobility of holes and electrons can be increased.

According to this embodiment mode, a semiconductor device can be provided in which a first SOI layer for an n-channel MISFET and a second SOI layer for a p-channel MISFET are provided over different insulating surfaces and crystal orientations of the SOI layers are different. In this embodiment mode, it is possible to provide a channel formation region so as to have a channel length direction parallel to a crystal orientation with which field effect mobility of electrons and holes is the highest in each MISFET. Further, even in the case where the first SOI layer and the second SOI layer having the same crystal orientation are used, carriers can flow in different crystal axis directions while keeping the directions of the channels of the n-channel MISFET and the p-channel MISFET parallel. By employing the crystal orientation with which mobility of carriers flowing in the channel of the transistor is increased, the semiconductor integrated circuit can be operated at higher speed. Further, low voltage driving becomes possible, and low power consumption can be achieved. In other words, the possibility of carriers scattered by atoms can be reduced, whereby resistance which electrons and holes meet with can be reduced, and performance of the transistor can be improved. In addition, since a structure for element isolation is not required in this embodiment mode, the manufacturing process can be simplified.

In addition, when the single-crystalline semiconductor layers having different crystal orientations are bonded to the substrate, the single-crystalline semiconductor layers are formed over the different flat insulating layers; therefore, the insulating layers and the single-crystalline semiconductor layers can be easily bonded to each other. Further, since the single-crystalline semiconductor layers which form the MISFETs having different conductivity types are formed over the different insulating layers, parasitic capacitance between the single-crystalline semiconductor layers of the MISFETs having different conductivity types, or parasitic capacitance between the gate electrodes of the MISFETs having different conductivity types can be reduced. Therefore, a high-performance semiconductor device can be manufactured.

In this embodiment mode, the method of separating the single-crystalline semiconductor layer from the bond wafer by irradiation with the hydrogen ions or the like to a certain depth has been described; however, another SOI technique can also be employed to manufacture a similar base substrate. For example, a porous silicon layer is formed by anodization of the surface of a bond wafer, and a single-crystalline silicon layer formed by epitaxial growth is formed thereon. This single-crystalline silicon layer can be used as the SOI layer described in this embodiment mode. When using the bond wafer having this structure, a water jet method is used to separate the porous silicon layer and the single-crystalline silicon layer formed by epitaxial growth.

According to this embodiment mode, the single-crystalline semiconductor layers (SOI layers) having different crystal orientations can be formed over the base substrate included in the semiconductor integrated circuit. The crystal orientations can be determined so as to obtain high field effect mobility of the n-channel MISFET and the p-channel MISFET. By using such a base substrate, high performance and higher integration of the semiconductor integrated circuit can be realized.

Embodiment Mode 2

This embodiment mode will describe an n-channel MISFET and a p-channel MISFET which have different thicknesses of a gate insulating layer, and a manufacturing process thereof.

Figure 14A:
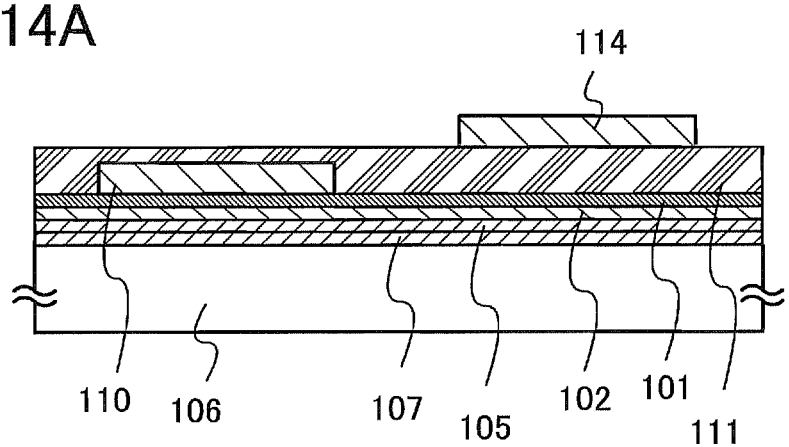
FIGS. 14A and 14B illustrate manufacturing steps of a semiconductor device.

First, a silicon oxide film 107 is formed over a base substrate 106, a silicon oxide film 105 is formed over the silicon oxide film 107, a silicon nitride oxide film 102 is formed over the silicon oxide film 105, a silicon oxynitride film 101 is formed over the silicon nitride oxide film 102, a first SOI layer 110 is formed over the silicon oxynitride film 101 as selected, an insualting layer 111 is formed over the first SOI layer 110 and the silicon oxynitride film 101, and a second SOI layer 114 is formed over the insulating layer 111 (FIG. 14A). These steps are similar to those in FIGS. 1A to 3C and thus explanation thereof is omitted.

Figure 14B:
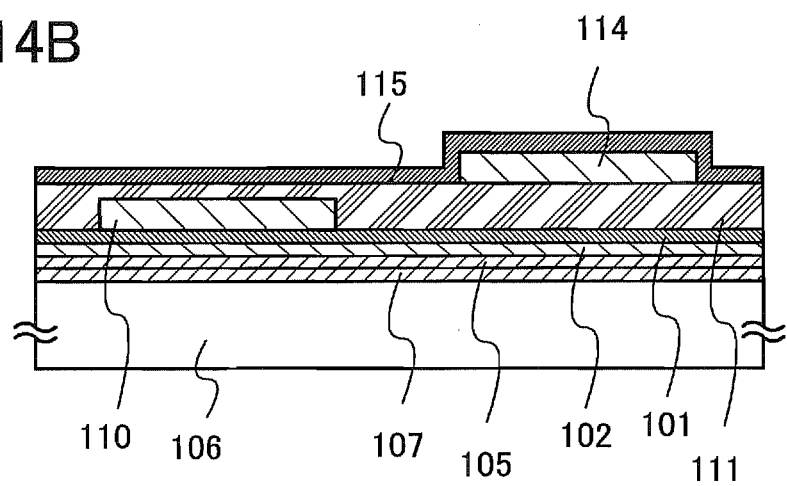

An insulating layer 115 serving as a gate insulating layer is formed over the second SOI layer 114 and the insulating layer 111 (FIG. 14B). Here, as the insulating layer 115, a similar material used for the insulating layer 115 in Embodiment Mode 1 can be used.

Figure 15:
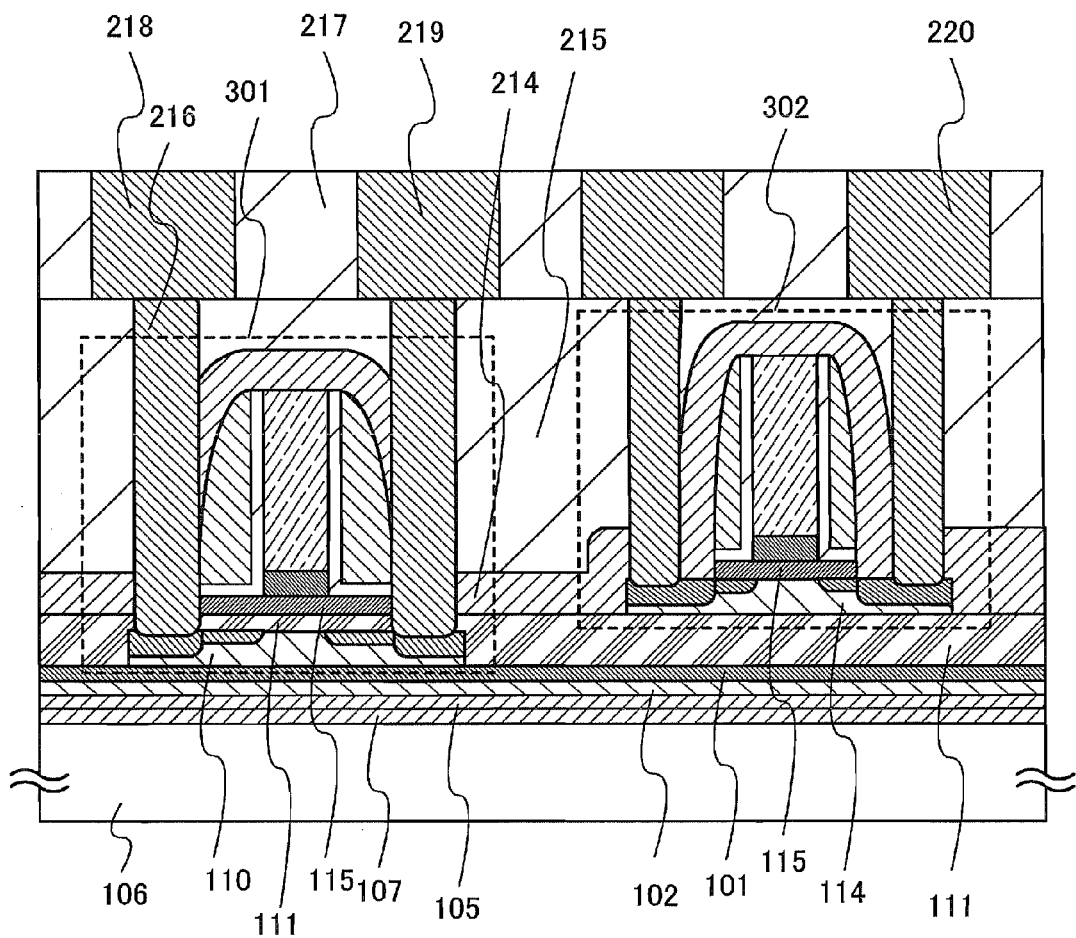
FIG. 15 illustrates a manufacturing step of a semiconductor device.

The subsequent steps are similar to those in FIGS. 5A to 11B, and a semiconductor device including an n-channel MISFET 301 and a p-channel MISFET 302 as illustrated in FIG. 15 can be formed. In the semiconductor device illustrated in FIG. 15, in addition to the structure of the semiconductor device illustrated in FIGS. 11A and 11B, the insulating layer 111 is formed between the first SOI layer 110 and the insulating layer 115 in the n-channel MISFET 301, and the insulating layers 115 and 111 serve as a gate insulating layer of the n-channel MISFET 301. Therefore, in the semiconductor device of this embodiment mode, the gate insulating layer of the n-channel MISFET 301 can be thicker than that of the p-channel MISFET 302.

In this embodiment mode, since the gate insulating layer of the n-channel MISFET 301 can be thicker than that of the p-channel MISFET 302, withstand voltage of the n-channel MISFET 301 can be increased, and reliability of the semiconductor device can be improved.

Further, according to this embodiment mode, a semiconductor device can be provided in which the first SOI layer 110 for the n-channel MISFET 301 and the second SOI layer 114 for the p-channel MISFET 302 are provided over the different insulating surfaces and crystal orientations of the SOI layers are different. In this embodiment mode, it is possible to provide a channel formation region so as to have a channel length direction parallel to a crystal orientation with which field effect mobility of electrons and holes is the highest in each MISFET. Further, even in the case where the first SOI layer 110 and the second SOI layer 114 layer having the same crystal orientation are used, carries can flow in different crystal axis directions while keeping the directions of the channels of the n-channel MISFET and the p-channel MISFET parallel. By employing the crystal orientation with which mobility of carriers flowing in the channel of the transistor is increased, the semiconductor integrated circuit can be operated at higher speed. Further, low voltage driving becomes possible, and low power consumption can be achieved. In other words, the possibility of carriers scattered by atoms can be reduced, whereby resistance which electrons and holes meet with can be reduced, and performance of the transistor can be improved. In addition, since a structure for element isolation is not required in this embodiment mode, the manufacturing process can be simplified.

In addition, when the single-crystalline semiconductor layers having different crystal orientations are bonded to the substrate, the single-crystalline semiconductor layers are formed over the different flat insulating layers; therefore, the insulating layers and the single-crystalline semiconductor layers can be easily bonded to each other. Further, since the single-crystalline semiconductor layers which form the MISFETs having different conductivity types are formed over the different insulating layers, parasitic capacitance between the single-crystalline semiconductor layers of the MISFETs having different conductivity types, or parasitic capacitance between the gate electrodes of the MISFETs having different conductivity types can be reduced. Therefore, a high-performance semiconductor device can be manufactured.

According to this embodiment mode, the single-crystalline semiconductor layers (SOI layers) having different crystal orientations can be formed over the base substrate included in the semiconductor integrated circuit. The crystal orientations can be determined so as to obtain high field effect mobility of the n-channel MISFET and the p-channel MISFET. By using such a base substrate, high performance of the semiconductor integrated circuit can be realized.

Embodiment Mode 3

As described in the preceding embodiment modes, in the case of bonding semiconductor layers having different crystal orientations to a base substrate, a more preferred mode is that crystal axes in channel length directions are directed toward specific directions. Anisotropy in carrier mobility of electrons and holes flowing through a channel formation region of a MISFET can be more favorable by considering anisotropy in crystal orientation of an SOI layer and anisotropy in carrier flow direction. This is because effective mass of carriers has anisotropy in crystals.

Figure 16A:
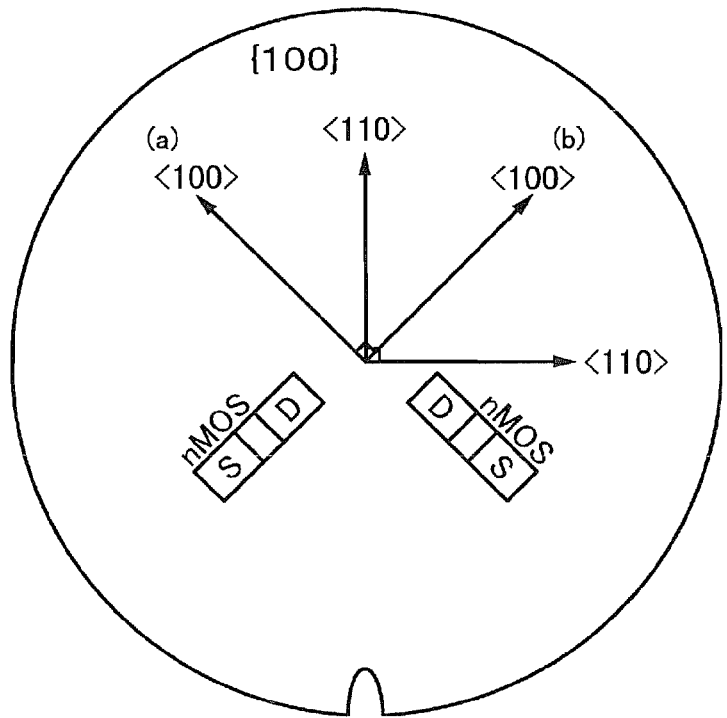
FIGS. 16A and 16B illustrate an example of crystal orientations of SOI layers for a p-channel MISFET and an n-channel MISFET.
Figure 16B:
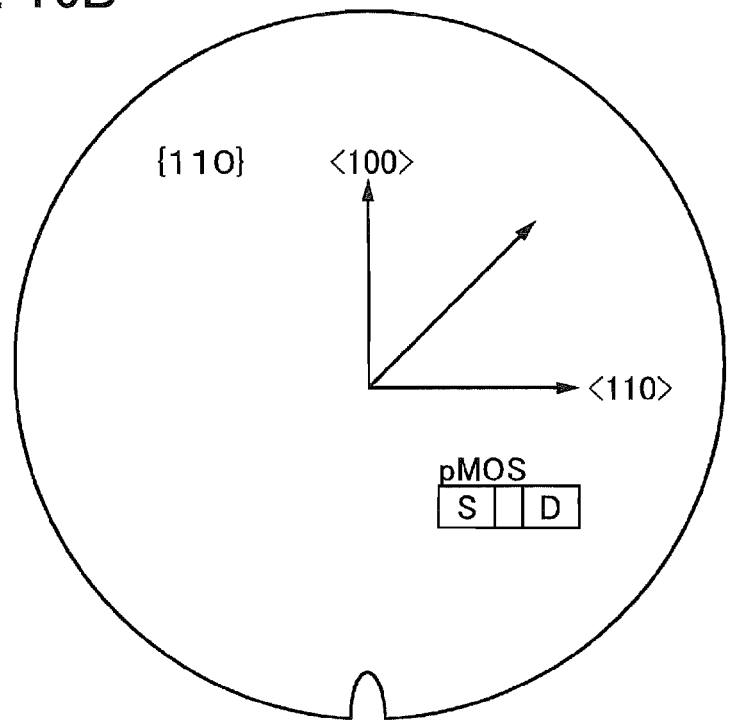

As illustrated in FIG. 16A, in the case of taking an SOI layer for an n-channel MISFET from a bond wafer whose plane orientation plane orientation is {100}, it is preferable that a channel length direction be parallel to a <100> axis. On the other hand, in order to form an SOI layer for a p-channel MISFET, as illustrated in FIG. 16B, it is preferable that a bond wafer whose plane orientation plane orientation is {110} be used and a channel length direction be parallel to a <110> axis. When the <100> axis is set for the n-channel MISFET and the <110> axis is set for the p-channel MISFET in this manner, field effect mobility of electrons and holes flowing through channel formation regions can be more increased.

Embodiment Mode 4

Figure 17A:
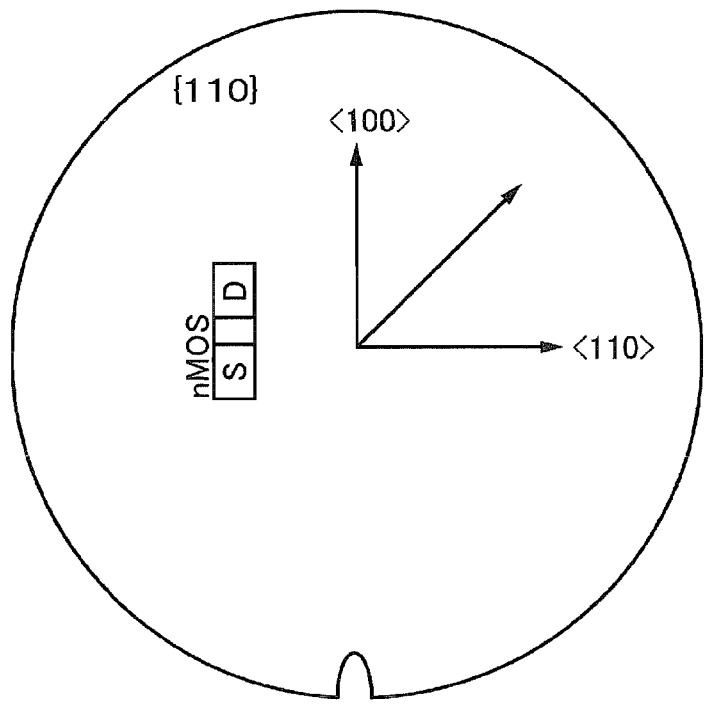
FIGS. 17A and 17B illustrate an example of crystal orientations of SOI layers for a p-channel MISFET and an n-channel MISFET.
Figure 17B:
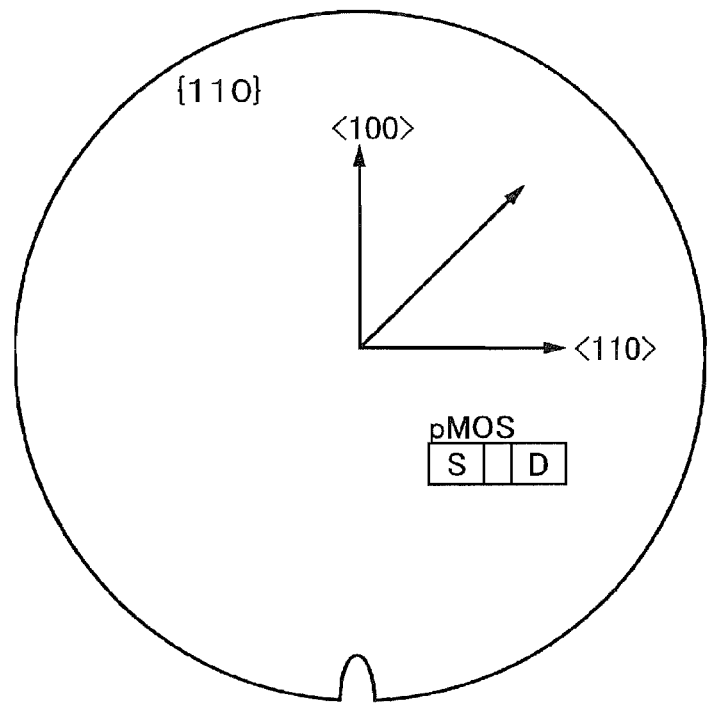

This embodiment mode will describe a structure in which SOI layers appropriate for an n-channel MISFET and a p-channel MISFET are taken from bond wafers having the same crystal orientation. FIGS. 17A and 17B illustrate the case of using a bond wafer whose plane orientation is {110}. In this case, the SOI layer for the n-channel MISFET is taken so that a channel length direction is parallel to a <100> axis as illustrated in FIG. 17A. On the contrary, the SOI layer for the p-channel MISFET is taken so that a channel length direction is parallel to a <110> axis as illustrated in FIG. 17B.

According to this embodiment mode, a semiconductor integrated circuit can be provided in which crystal orientations of a first SOI layer forming an n-channel MISFET and a second SOI layer forming a p-channel MISFET, which are over an insulating substrate, are the same and directions of crystal axes in channel length directions thereof are different. When the <100> axis is set for the n-channel MISFET and the <110> axis is set for the p-channel MISFET in this manner, field effect mobility of electrons and holes flowing through channel formation regions can be further increased. In addition, a step of bonding the SOI layer of the n-channel MISFET to a base substrate differs from a step of bonding the SOI layer of the p-channel MISFET to the base substrate. Therefore, freedom of design in circuit layout of the n-channel MISFET and the p-channel MISFET is ensured; accordingly, integration of the semiconductor integrated circuit can be increased. Since a crystal orientation or a crystal axis with which high field effect mobility can be obtained for each of the n-channel MISFET and the p-channel MISFET is selected, using such a base substrate can realize high performance of the semiconductor integrated circuit.

Embodiment Mode 5

Figure 18:
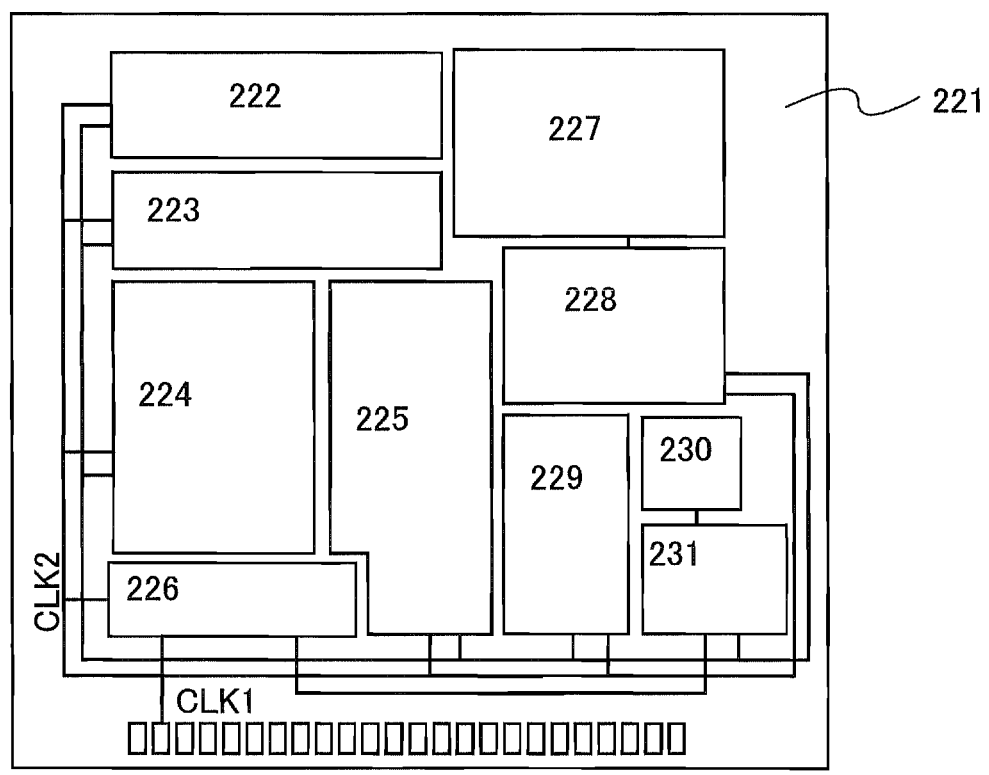
FIG. 18 is a block diagram of one mode of a microprocessor.

This embodiment mode will describe a mode of a microprocessor as an example of semiconductor devices with reference to FIG. 18.

FIG. 18 illustrates an example of a microprocessor 221. In this microprocessor 221, crystal orientations of an SOT layer for an n-channel MISFET and an SOI layer for a p-channel MISFET are different from each other as described in Embodiment Modes 3 and 4. Alternatively, crystal orientations of the SOI layer for the n-channel MISFET and the SOI layer for the p-channel MISFET are the same, and flow directions of electrons or holes are different crystal axis directions in the n-channel MISFET and the p-channel MISFET. Further, the SOI layer for the n-channel MISFET and the SOI layer for the p-channel MISFET are formed over different insulating layers.

The microprocessor 221 includes an arithmetic logic unit (ALU) 222, an ALU controller 223, an instruction decoder 224, an interrupt controller 225, a timing controller 226, a register 227, a register controller 228, a bus interface (Bus I/F) 229, a read only memory (ROM) 230, and a ROM interface (ROM I/F) 231.

An instruction input to the microprocessor 221 via the bus interface 229 is input to the instruction decoder 224 and decoded therein, and then, input to the ALU controller 223, the interrupt controller 225, the register controller 228, and the timing controller 226. The ALU controller 223, the interrupt controller 225, the register controller 228, and the timing controller 226 conduct respective controls based on the decoded instruction. Specifically, the ALU controller 223 generates signals to control operation of the ALU 222. While the microprocessor 221 is executing a program, the interrupt controller 225 judges an interrupt request from an external input/output device or a peripheral circuit based on its priority or a mask state, and processes the request. The register controller 228 generates an address of the register 227, and reads/writes data from/to the register 227 in accordance with the state of the microprocessor.

The timing controller 226 generates signals to control drive timing of the ALU 222, the ALU controller 223, the instruction decoder 224, the interrupt controller 225, and the register controller 228. For example, the timing controller 226 is provided with an internal clock generator for generating an internal clock signal CLK2 based on a reference clock signal CLK1, and supplies the internal clock signal CLK2 to the above-described circuits. The microprocessor 221 illustrated in FIG. 18 is just an example in which the structure is illustrated simply, and real microprocessors have various structures depending on the uses.

In the microprocessor of this embodiment mode, a first SOI layer for a p-channel MISFET and a second SOI layer for an n-channel MISFET are provided over different insulating surfaces and crystal orientations of the first SOI layer and the second SOI layer are different. Alternatively, even in the case where the first SOI layer and the second SOI layer having the same crystal orientation are used, carriers flow in different crystal axis directions while keeping the directions of the channels of the n-channel MISFET and the p-channel MISFET parallel. By employing crystal orientations with which mobility of carriers flowing through channels of transistors is increased, high speed operation of the microprocessor can be achieved. Further, low voltage driving becomes possible, and low power consumption can be achieved. In other words, the possibility of carriers scattered by atoms can be reduced, whereby resistance which electrons and holes meet with can be reduced, and performance of the microprocessor can be improved.

Embodiment Mode 6

Figure 19:
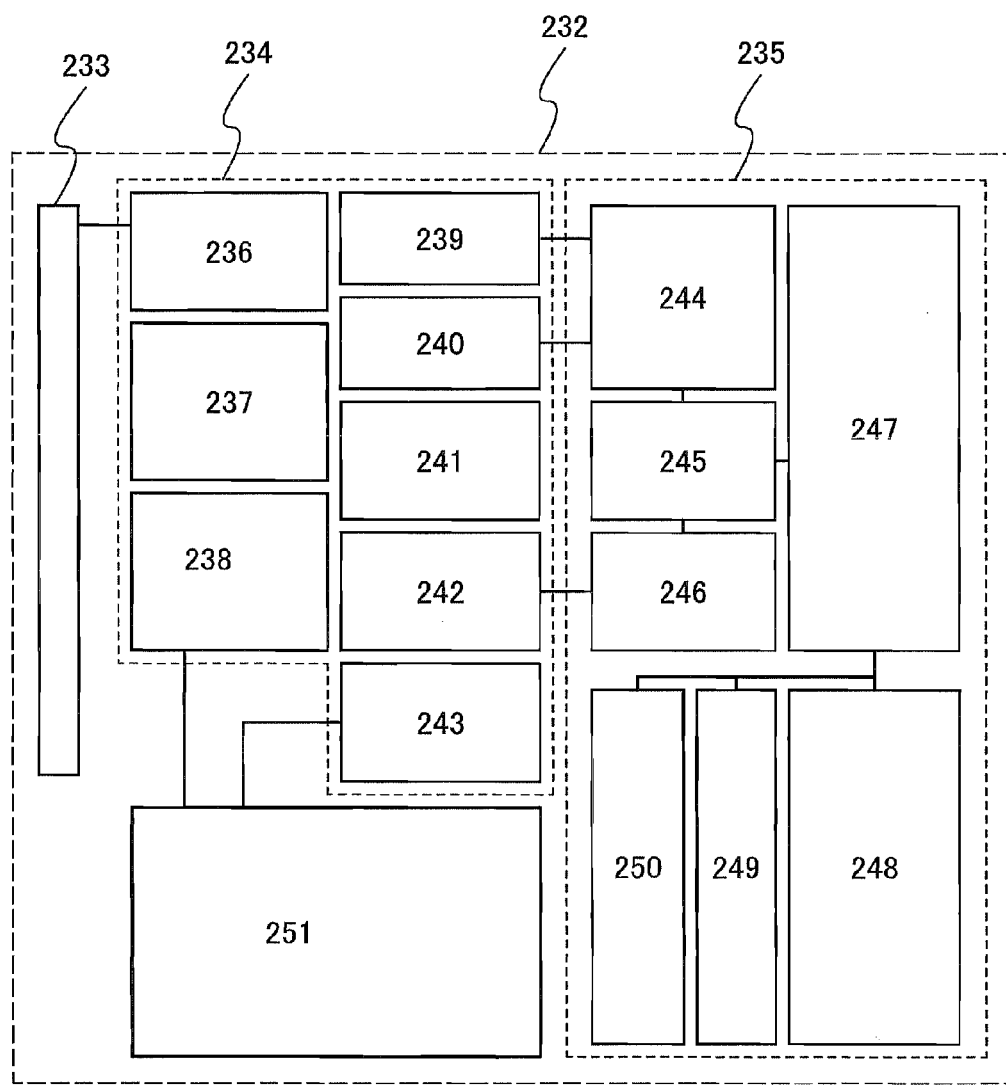
FIG. 19 is a block diagram of one mode of a microcomputer

This embodiment mode will describe a mode of a microcomputer including a communication circuit and capable of inputting and outputting data without contact as an example of semiconductor devices using the n-channel MISFET and the p-channel MISFET described in the preceding embodiment modes, with reference to FIG. 19.

FIG. 19 is a block diagram of a microcomputer 232 according to this embodiment mode. This microcomputer 232 includes an antenna circuit 233, an analog circuit portion 234, and a digital circuit portion 235. The analog circuit portion 234 includes a resonant circuit 236 including a resonant capacitor, a constant voltage circuit 237, a rectifier circuit 238, a demodulation circuit 239, a modulation circuit 240, a reset circuit 241, an oscillation circuit 242, and a power supply management circuit 243. The digital circuit portion 235 includes an RF interface 244, a control register 245, a clock controller 246, an interface 247, a central processing unit 248, a random access memory 249, and a read only memory 250. Electric power necessary for operation of the microcomputer 232 is obtained by receiving a wireless signal by the antenna circuit 233 and rectifying the signal by the rectifier circuit 238, and the electric power is stored in a capacitor portion 251. The capacitor portion 251 is formed using a capacitor such as a ceramic capacitor or an electric double layer capacitor. The capacitor portion 251 is not necessarily integrated with the microcomputer 232, and may be attached, as another part, to a substrate having an insulating surface which forms the microcomputer 232.

Operation of the microcomputer 232 having the above-described structure is described below. From a signal received by the antenna circuit 233, induced electromotive force is generated by the resonant circuit 236. The input signal is demodulated by the demodulation circuit 239 and then a control instruction and a data signal are output to the digital circuit portion 235. The reset circuit 241 generates a signal for resetting and initializing the digital circuit portion 235. For example, a signal which rises after increase in the power supply voltage is generated as the reset signal. The oscillation circuit 242 changes the frequency and the duty ratio of a clock signal in response to a control signal generated by the constant voltage circuit 237. The demodulation circuit 239 having a low-pass filter, for example, binarizes changes in amplitude of reception signals of an amplitude shift keying (ASK) system. The modulation circuit 240 transmits data after changing the amplitude of the ASK transmission signal. The modulation circuit 240 changes the resonance point of the resonant circuit 236, thereby changing the amplitude of communication signals. The clock controller 246 generates a control signal for changing the frequency and the duty ratio of the clock signal in accordance with the power supply voltage or current consumption in the central processing unit 248. The power supply voltage is monitored by the power supply management circuit 243.

A signal that is input from the antenna circuit 233 to the microcomputer 232 is demodulated by the demodulation circuit 239, and then divided into a control command, data, and the like by the RF interface 244. The control command is stored in the control register 245. The control command includes reading of data stored in the read only memory 250, writing of data to the random access memory 249, an arithmetic instruction to the central processing unit 248, and the like. The central processing unit 248 accesses the read only memory 250, the random access memory 249, and the control register 245 via the interface 247. The interface 247 has a function of generating an access signal for any of the read only memory 250, the random access memory 249, and the control register 245 based on an address requested by the central processing unit 248.

As an arithmetic method of the central processing unit 248, a method may be employed in which the read only memory 250 stores an OS (operating system) and a program is read out and executed at the time of starting operation. Alternatively, a method may be employed in which a circuit dedicated to arithmetic is formed and an arithmetic process is performed using hardware. In a method in which both hardware and software are used, a method can be used in which part of arithmetic process is performed in the circuit dedicated to arithmetic and the other part of the arithmetic process is performed by the central processing unit 248 using a program.

Figure 20:
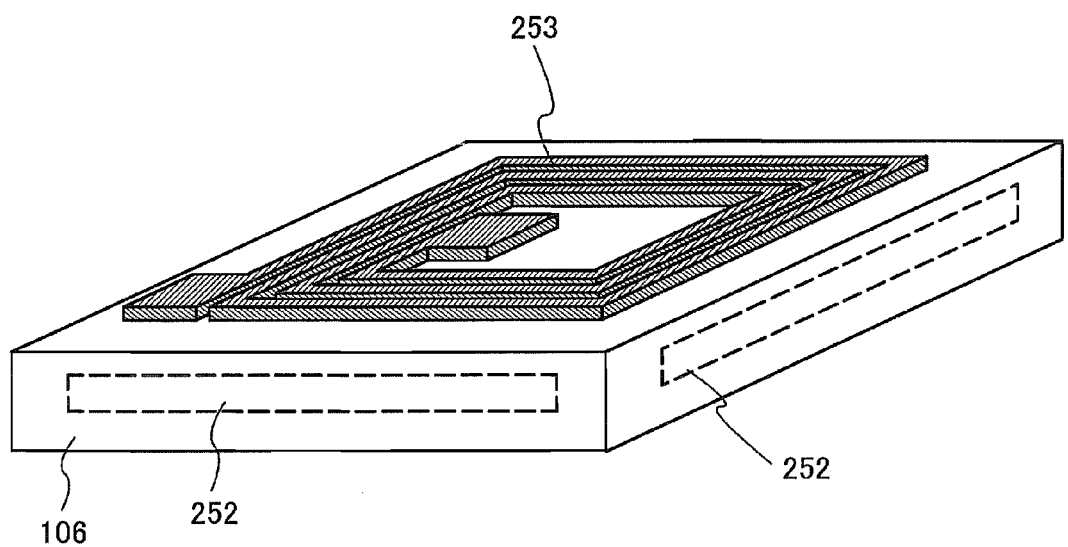
FIG. 20 is a perspective view of an exterior example of a microcomputer.

FIG. 20 shows the exterior of a microcomputer having the above-described structure according to this embodiment mode. A plurality of SOI layers are provided over a base substrate 106; accordingly, an element formation layer 252 in which an n-channel MISFET and a p-channel MISFET are formed is provided. The element formation layer 252 forms the analog circuit portion 234 and the digital circuit portion 235 of FIG. 19. An antenna 253 is provided over the base substrate 106. Instead of the antenna 253, an antenna connection terminal may be provided. The antenna 253 illustrated in FIG. 20 is a magnetic-field spiral antenna; however, the antenna 253 may be combined with a dipole antenna or the like as an electric field antenna.

Figure 21:
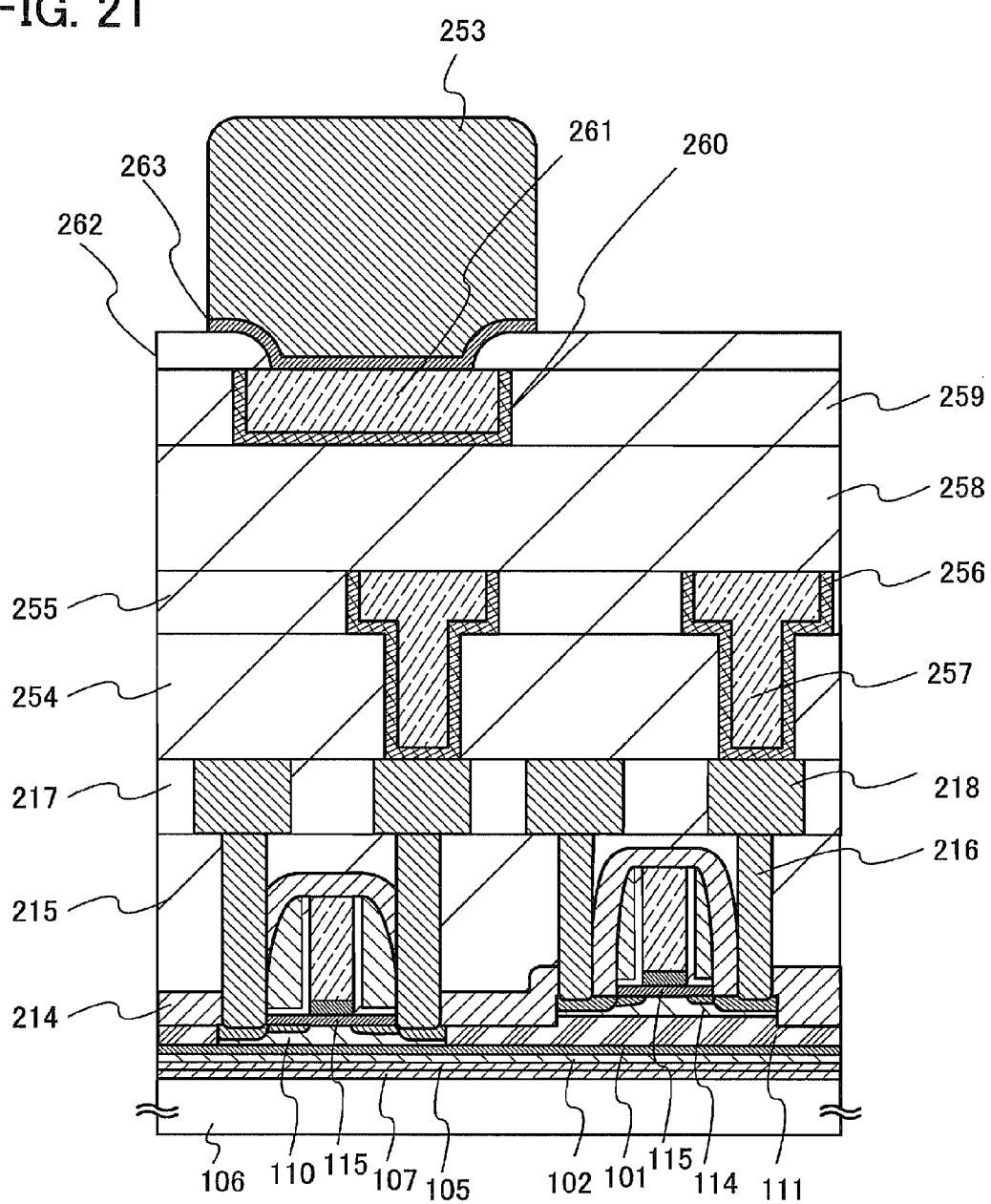
FIG. 21 is a cross-sectional view illustrating a structure of a microcomputer.

FIG. 21 schematically shows a cross-sectional structure of part of the microcomputer of FIG. 20. Over the base substrate 106, an n-channel MISFET and a p-channel MISFET are formed by using a first SOI layer 110 and a second SOI layer 114, respectively. Since the structure of layers that are lower than a second interlayer insulating layer 217 is similar to that in FIGS. 11A and 11B, explanation thereof is omitted.

A third interlayer insulating layer 254 and a fourth interlayer insulating layer 255 are formed over a first wiring 218. The third interlayer insulating layer 254 is formed using a silicon oxide film, and the fourth interlayer insulating layer 255 is formed using a silicon nitride film. In the third interlayer insulating layer 254 and the fourth interlayer insulating layer 255, openings that are different in size are formed by dual damascene. In the opening, a barrier metal 256 of tantalum nitride or the like is formed, and a copper wiring 257 is formed by copper plating. Further, a fifth interlayer insulating layer 258 and a sixth interlayer insulating layer 259 are formed, and a barrier metal 260 and a copper wiring 261 by copper plating are provided. Then, an antenna 253 is provided over a seventh interlayer insulating layer 262. A seed layer 263 is provided in the case of forming the antenna 253 by a copper plating method. The antenna 253 can also be formed by depositing a conductive film of aluminum or the like by sputtering and processed into an antenna shape by photolithography.

Productivity of such a microcomputer can be improved by using a large-area glass substrate as the base substrate 106. For example, a glass substrate of 730 mm×920 mm is used for the fourth-generation liquid crystal panels which are distributed in the market, and the area thereof is 671600 mm$^2$. When chips of 2 mm×2 mm are taken out, roughly 340 thousand chips can be taken out without counting in margins of the chips. Further, when chips of 1 mm×1 mm are taken out, roughly 670 thousand chips can be taken out. Furthermore, when chips of 0.4 mm×0.4 mm are taken out, roughly 4 million chips can be taken out. The thickness of the glass substrate is 0.4 mm to 0.7 mm, and when a protection film is attached to a surface opposite to a surface to which the SOI layers are fixed, the thickness of the glass substrate can be thinned to about 0.1 mm to 0.3 mm.

In the microcomputer of this embodiment mode, the first SOI layer for the p-channel MISFET and the second SOI layer for the n-channel MISFET are provided over different insulating surfaces, and crystal orientations of the SOT layers are different. Alternatively, even in the case where the first SOI layer and the second SOI layer having the same crystal orientation are used, carriers flow in different crystal axis directions while keeping the directions of the channels of the n-channel MISFET and the p-channel MISFET parallel. By employing crystal orientations with which mobility of carriers flowing through channels of transistors is increased, high speed operation of the microcomputer can be achieved. Further, low voltage driving becomes possible, and low power consumption can be achieved. In other words, the possibility of carriers scattered by atoms can be reduced, whereby resistance which electrons and holes meet with can be reduced, and performance of the microprocessor can be improved.

This application is based on Japanese Patent Application Serial No. 2007-131229 filed with Japan Patent Office on May 17, 2007, the entire contents of which are hereby incorporated by reference.

What is claimed is:

1. A semiconductor device comprising:
   a first insulating layer over a substrate;
   a first single-crystalline semiconductor layer over and in contact with the first insulating layer;
   a second insulating layer over the first insulating layer, the second insulating layer comprising a first region and a second region; and
   a second single-crystalline semiconductor layer over the first region of the second insulating layer;
   wherein a thickness of the first region of the second insulating layer is larger than a thickness of the second region of the second insulating layer,
   wherein a crystal plane orientation of the first single-crystalline semiconductor layer is the same as a crystal plane orientation of the second single-crystalline semiconductor layer; and
   wherein crystal axes in channel length directions of the first single-crystalline semiconductor layer and the second single-crystalline semiconductor layer are different from each other.

2. The semiconductor device according to claim 1, wherein the first single-crystalline semiconductor layer has an n-type conductivity and the second single-crystalline semiconductor layer has a p-type conductivity.

3. The semiconductor device according to claim 1, wherein the first single-crystalline semiconductor layer has a p-type conductivity and the second single-crystalline semiconductor layer has an n-type conductivity.

4. The semiconductor device according to claim 1,
   wherein the crystal plane orientation of the first single-crystalline semiconductor layer and the crystal plane orientation of the second single-crystalline semiconductor layer are {110}; and
   wherein the crystal axis in a channel length direction of the first single-crystalline semiconductor layer is <100> and the crystal axis in a channel length direction of the second single-crystalline semiconductor layer is <110>.

5. The semiconductor device according to claim 1,
   wherein the crystal plane orientation of the first single-crystalline semiconductor layer and the crystal plane orientation of the second single-crystalline semiconductor layer are {110}; and
   wherein a crystal axis in a channel length direction of the first single-crystalline semiconductor layer is <110> and a crystal axis in a channel length direction of the second single-crystalline semiconductor layer is <100>.

6. The semiconductor device according to claim 1, further comprising: a third insulating film over and in contact with the first single-crystalline semiconductor layer and the second single-crystalline semiconductor layer.

7. The semiconductor device according to claim 1, wherein the first insulating layer is a silicon oxide film, a silicon oxynitride film, or a silicon nitride oxide film.

8. The semiconductor device according to claim 1, wherein the second insulating layer is a silicon oxide film, a silicon oxynitride film, or a silicon nitride oxide film.

9. The semiconductor device according to claim 1, wherein the substrate is a glass substrate.

10. A semiconductor device comprising:
a first insulating layer over a substrate;
a first single-crystalline semiconductor layer over and in contact with the first insulating layer;
a second insulating layer over the first single-crystalline semiconductor layer and the first insulating layer; and
a second single-crystalline semiconductor layer over the second insulating layer;
wherein an entire top surface of the first single-crystalline semiconductor layer is covered with the second insulating layer,
wherein a crystal plane orientation of the first single-crystalline semiconductor layer is the same as a crystal plane orientation of the second single-crystalline semiconductor layer; and
wherein crystal axes in channel length directions of the first single-crystalline semiconductor layer and the second single-crystalline semiconductor layer are different from each other.

11. The semiconductor device according to claim 10, wherein the first single-crystalline semiconductor layer has an n-type conductivity and the second single-crystalline semiconductor layer has a p-type conductivity.

12. The semiconductor device according to claim 10, wherein the first single-crystalline semiconductor layer has a p-type conductivity and the second single-crystalline semiconductor layer has an n-type conductivity.

13. The semiconductor device according to claim 10,
wherein the crystal plane orientation of the first single-crystalline semiconductor layer and the crystal plane orientation of the second single-crystalline semiconductor layer are {110}; and
wherein the crystal axis in a channel length direction of the first single-crystalline semiconductor layer is <100> and the crystal axis in a channel length direction of the second single-crystalline semiconductor layer is <110>.

14. The semiconductor device according to claim 10,
wherein the crystal plane orientation of the first single-crystalline semiconductor layer and the crystal plane orientation of the second single-crystalline semiconductor layer are {110}; and
wherein the crystal axis in a channel length direction of the first single-crystalline semiconductor layer is <110> and the crystal axis in a channel length direction of the second single-crystalline semiconductor layer is <100>.

15. The semiconductor device according to claim 10, wherein the first insulating layer is a silicon oxide film, a silicon oxynitride film, or a silicon nitride oxide film.

16. The semiconductor device according to claim 10, wherein the second insulating layer is a silicon oxide film, a silicon oxynitride film, or a silicon nitride oxide film.

17. The semiconductor device according to claim 10, wherein the substrate is a glass substrate.

* * * * *

UNITED STATES PATENT AND TRADEMARK OFFICE
CERTIFICATE OF CORRECTION

Page 1 of 1

PATENT NO. : 8,592,907 B2
APPLICATION NO. : 13/075460
DATED : November 26, 2013
INVENTOR(S) : Hideto Ohnuma It is certified that error appears in the above-identified patent and that said Letters Patent is hereby corrected as shown below:

In the Specification

At column 7, line 9, "{114}" should be --{110}--;

At column 7, line 16, "SOT" should be --SOI--;

At column 8, line 30, "SOT" should be --SOI--;

At column 8, line 47, "SOT" should be --SOI--;

At column 9, line 22, "SOT" should be --SOI--;

At column 12, line 58, "SOT" should be --SOI--;

At column 15, line 61, "SOT" should be --SOI--.

Signed and Sealed this
First Day of April, 2014

Michelle K. Lee
*Deputy Director of the United States Patent and Trademark Office*